(12) United States Patent
Jeong et al.

(10) Patent No.: US 12,389,676 B2
(45) Date of Patent: Aug. 12, 2025

(54) COOLING DEVICE SEMICONDUCTOR DEVICE INCLUDING END CURVED INTERCONNECTION LINES

(71) Applicant: Samsung Electronics Co., Ltd., Suwon-si (KR)

(72) Inventors: Minjae Jeong, Yongin-si (KR); Jungho Do, Hwaseong-si (KR); Jae-Woo Seo, Seoul (KR); Jisu Yu, Seoul (KR); Hyeongyu You, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 536 days.

(21) Appl. No.: 17/576,279

(22) Filed: Jan. 14, 2022

(65) Prior Publication Data
US 2022/0375962 A1 Nov. 24, 2022

(30) Foreign Application Priority Data

May 24, 2021 (KR) .......................... 10-2021-0066049

(51) Int. Cl.
*H10D 84/90* (2025.01)
*G03F 1/36* (2012.01)
(Continued)

(52) U.S. Cl.
CPC ............. *H10D 84/907* (2025.01); *G03F 1/36* (2013.01); *G06F 30/398* (2020.01); *H01L 21/76816* (2013.01); *H10D 89/10* (2025.01); *H10D 84/975* (2025.01); *H10D 84/981* (2025.01); *H10D 84/985* (2025.01)

(58) Field of Classification Search
CPC ........... H01L 27/11807; H01L 27/0207; H01L 27/088; H01L 23/528; H01L 23/5283; H01L 23/5286; H01L 23/5386; H01L 2027/11875; H01L 2027/11881;
(Continued)

(56) References Cited

U.S. PATENT DOCUMENTS 8,661,392 B2 2/2014 Quandt et al.
9,263,323 B2 2/2016 Sonoda
(Continued)

FOREIGN PATENT DOCUMENTS

| JP | 2019114641 | 7/2019 | |
|---|---|---|---|
| KR | 1020170136831 A | 12/2017 | |
| KR | 20180101698 A * | 9/2018 | ......... H01L 27/0207 |

*Primary Examiner* — Ida M Soward
(74) *Attorney, Agent, or Firm* — Muir Patent Law, PLLC

(57) ABSTRACT

A semiconductor device may include a substrate including a first logic cell and a second logic cell, which are adjacent to each other in a first direction and shares a cell border, a first metal layer on the substrate, the first metal layer including a power line, which is disposed on the cell border to extend in a second direction crossing the first direction and has a center line parallel to the second direction, and a second metal layer on the first metal layer. The second metal layer may include a first upper interconnection line and a second upper interconnection line, which are provided on each of the first and second logic cells. The first upper interconnection line may extend along a first interconnection track and the first direction. The second upper interconnection line may extend along a second interconnection track and in the first direction.

15 Claims, 33 Drawing Sheets

(51) Int. Cl.
 *G06F 30/398* (2020.01)
 *H01L 21/768* (2006.01)
 *H10D 89/10* (2025.01)

(58) Field of Classification Search
 CPC .. G06F 30/398; H10D 84/907; H10D 84/975; H10D 84/981; H10D 84/985; H10D 84/83
 See application file for complete search history.

(56) References Cited

U.S. PATENT DOCUMENTS

| | | | |
|---|---|---|---|
| 9,837,398 B1 | 12/2017 | Rowhani et al. | |
| 10,312,192 B2 | 6/2019 | Chang et al. | |
| 10,402,534 B2 | 9/2019 | Huang et al. | |
| 10,783,313 B2 | 9/2020 | Chang et al. | |
| 11,270,944 B2* | 3/2022 | Hong | H10D 30/6735 |
| 2007/0190812 A1* | 8/2007 | Ryoo | H01L 27/0203 |
| | | | 257/E27.099 |
| 2008/0037311 A1 | 2/2008 | Tanaka | |
| 2016/0300826 A1* | 10/2016 | Lee | H01L 23/528 |
| 2017/0032074 A1* | 2/2017 | Song | H10D 84/907 |
| 2018/0254287 A1* | 9/2018 | Seo | H01L 23/528 |
| 2020/0104448 A1 | 4/2020 | Yang et al. | |
| 2020/0104451 A1 | 4/2020 | Huang et al. | |
| 2020/0152640 A1* | 5/2020 | Do | H01L 23/5226 |
| 2021/0035902 A1* | 2/2021 | Kang | H01L 23/5226 |
| 2021/0134784 A1* | 5/2021 | Kim | H01L 29/78696 |
| 2021/0134785 A1* | 5/2021 | Yang | H01L 23/528 |
| 2022/0068805 A1* | 3/2022 | Lee | H01L 23/5286 |
| 2022/0068810 A1* | 3/2022 | Lim | H01L 27/0629 |
| 2022/0319907 A1* | 10/2022 | Lee | H01L 21/76224 |

* cited by examiner

COOLING DEVICE SEMICONDUCTOR DEVICE INCLUDING END CURVED INTERCONNECTION LINES

CROSS-REFERENCE TO RELATED APPLICATIONS

This U.S. non-provisional patent application claims priority under 35 U.S.C. § 119 to Korean Patent Application No. 10-2021-0066049, filed on May 24, 2021, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device including a field effect transistor and a method of fabricating the same.

Due to their small-sized, multifunctional, and/or low-cost characteristics, semiconductor devices are being esteemed as important elements in the electronics industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

An embodiment of the inventive concept provides a semiconductor device including a field effect transistor with improved reliability and a method of fabricating the same.

According to an embodiment of the inventive concept, a semiconductor device may include a substrate including a first logic cell and a second logic cell, which are adjacent to each other in a first direction and shares a cell border, a first metal layer on the substrate, the first metal layer including a power line, which is disposed on the cell border to extend in a second direction crossing the first direction and has a center line parallel to the second direction, and a second metal layer on the first metal layer. The second metal layer may include a first upper interconnection line of the first logic cell and a second upper interconnection line of the first logic cell provided on the first logic cell, and a first upper interconnection line of the second logic cell and a second upper interconnection line of the second logic cell provided on the second logic cell. The first upper interconnection lines may extend along a first interconnection track and the first direction. The first upper interconnection lines may have respective curved end lines facing he center line in a plan view. The second upper interconnection line may extend along a second interconnection track and in the first direction. The second upper interconnection lines may have respective curved end lines facing the center line in the plan view. The largest distance between the curved end line of the first upper interconnection line of the first logic cell and the center line in the first direction and the largest distance between the curved end line of the first upper interconnection line of the second logic cell and the center line in the first direction may be a first distance. The smallest distance between the curved end line of the second upper interconnection line of the first logic cell and the center line in the first direction may be a second distance. The first distance may be smaller than the second distance.

According to an embodiment of the inventive concept, a semiconductor device may include a substrate including a first logic cell and a second logic cell, which are adjacent to each other in a first direction and shares a cell border, active patterns on the substrate, gate electrodes on the active patterns, source/drain patterns in upper portions of the active patterns, active contacts on the source/drain patterns, gate contacts on the gate electrodes, a first metal layer on the active contacts and the gate electrodes, and a second metal layer on the first metal layer. The second metal layer may include a first upper interconnection line of the first logic cell and a second upper interconnection line of the first logic cell provided on the first logic cell, and a first upper interconnection line of the second logic cell and a second upper interconnection line of the second logic cell provided on the second logic cell. The first upper interconnection lines may extend along a first interconnection track and in the first direction. The second upper interconnection lines may extend along a second interconnection track and in the first direction. An end portion of the first upper interconnection line of the first logic cell and an end portion of the first upper interconnection line of the second logic cell may have concave profiles respectively, when viewed in a plan view. An end portion of the second upper interconnection line of the first logic cell and an end portion of the second upper interconnection line of the second logic cell may have convex profiles respectively, when viewed in the plan view.

According to an embodiment of the inventive concept, a method of fabricating a semiconductor device may include placing a first standard cell and a second standard cell, which are adjacent to each other in a first direction and shares a cell border, selectively forming a cutting pattern on the cell border, and performing a routing operation on the first standard cell and the second standard cell. Each of the first standard cell and the second standard cell may include an upper interconnection line, which extends along an interconnection track and in the first direction. The upper interconnection lines of the first and second standard cells may be spaced apart from the cell border. The cutting pattern may be formed between the upper interconnection line of the first standard cell and the upper interconnection line of the second standard cell, where a distance between the upper interconnection line of the first standard cell and the upper interconnection line of the second standard cell is smaller than a predetermined distance.

DETAILED DESCRIPTION

Example embodiments of the inventive concepts will now be described more fully with reference to the accompanying drawings, in which example embodiments are shown.

Figure 1:
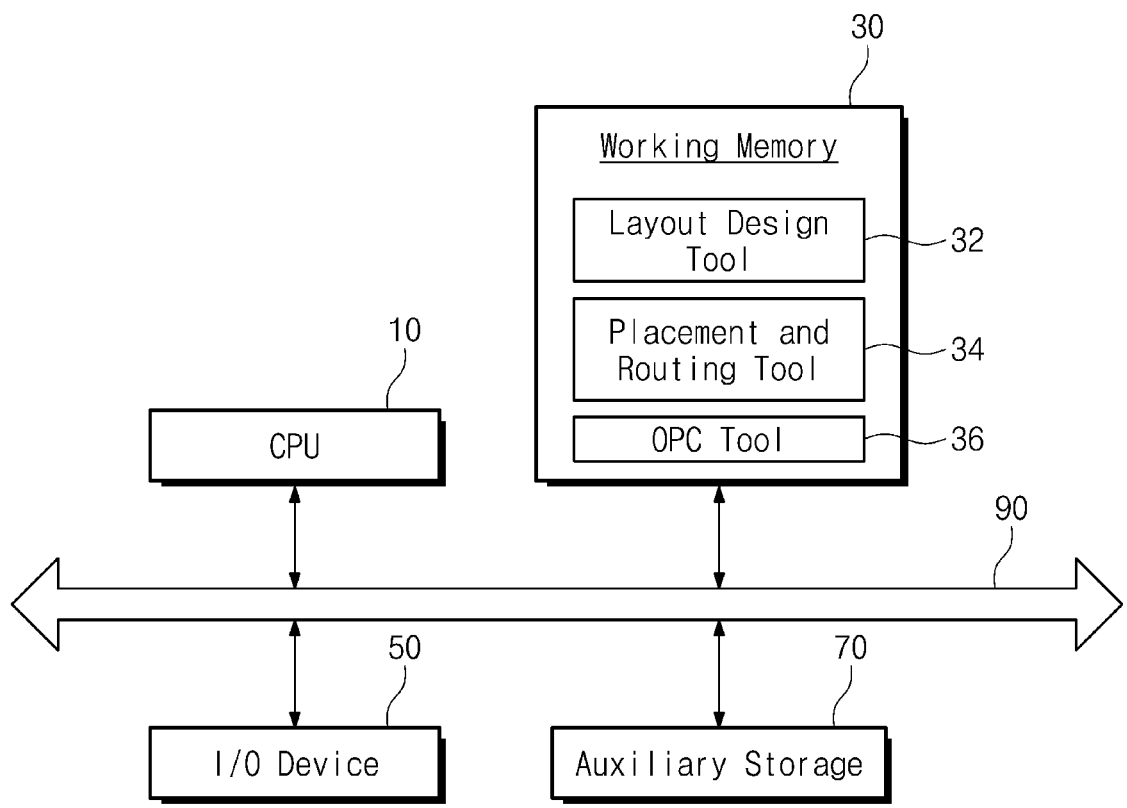
FIG. 1 is a block diagram illustrating a computer system which is configured to execute a semiconductor design process, according to an embodiment of the inventive concept.

FIG. 1 is a block diagram illustrating a computer system which is configured to execute a semiconductor design process, according to an embodiment of the inventive concept. Referring to FIG. 1, a computer system may include a CPU 10, a working memory 30, an input-output device 50, and an auxiliary storage 70. In an embodiment, the computer system may be provided as a system which is customized to execute a layout design process according to the inventive concept. Furthermore, the computer system may be configured to carry out various design and check simulation programs.

The CPU 10 may be configured to run a variety of software programs (e.g., application programs, operating systems, and device drivers) which are executed on the computer system. The CPU 10 may run an operating system loaded on the working memory 30. Furthermore, the CPU 10 may run various application programs, which are executed based on the operating system. For example, the CPU 10 may run a layout design tool 32, a placement and routing tool 34, and/or an OPC tool 36, which are loaded on the working memory 30.

The operating system or the application programs may be loaded on the working memory 30. For example, when the computer system starts a booting operation, an image of the operating system (not shown) stored in the auxiliary storage 70 may be loaded on the working memory 30 in accordance with a predetermined booting sequence. The overall input/output operations of the computer system may be managed by the operating system. Similarly, some application programs, which are selected by a user or are provided for basic services, may be loaded on the working memory 30.

The layout design tool 32, which is used for the layout design process, may be loaded on the working memory 30 from the auxiliary storage 70. The placement and routing tool 34, which is used to place the designed standard cells and to route the placed standard cells, may be loaded on the working memory 30 from the auxiliary storage 70. The OPC tool 36, which is used to execute an OPC process (e.g., an optical proximity correction operation) on the designed layout data, may be loaded on the working memory 30 from the auxiliary storage 70.

The layout design tool 32 may be configured to change biasing data for some layout patterns; for example, the layout design tool 32 may be configured to allow the specific layout patterns to have shapes and positions different from those given by a design rule. Furthermore, the layout design tool 32 may be configured to execute a design rule check (DRC) operation, under the condition of the changed bias data. The working memory 30 may be one of volatile memory devices (e.g., static or dynamic random access memory (SRAM or DRAM) devices) or nonvolatile memory devices (e.g., PRAM, MRAM, ReRAM, FRAM, and NOR FLASH memory devices).

The input-output device 50 may be configured to control user's data to be input and output through a user interface device. For example, the input-output device 50 may include a keyboard or a monitor, which are used to receive relevant information from a designer. By using the input-output device 50, it may be possible for the designer to receive information on regions or data paths, at which operating characteristics are needed to be adjusted, of a semiconductor device. The input-output device 50 may also be used to display a status or result of a process executed by the OPC tool 36.

The auxiliary storage 70 may be provided as a storage medium of the computer system. The auxiliary storage 70 may be used to store the application programs, the image of the operating system, and various kinds of data. The auxiliary storage 70 may be or include one of memory cards (e.g., MMC, eMMC, SD, MicroSD, and so forth), a hard disk drive (HDD), or a solid state drive (SSD). The auxiliary storage 70 may include a NAND FLASH memory device with a large memory capacity. In an embodiment, the auxiliary storage 70 may include or may be one or more of next-generation non-volatile memory devices (e.g., PRAM, MRAM, ReRAM, and FRAM devices) or a NOR FLASH memory device.

A system interconnector 90 may be further provided as a system bus for an internal network of the computer system. The CPU 10, the working memory 30, the input-output device 50, and the auxiliary storage 70 may be electrically connected to each other through the system interconnector 90 to exchange data between them. However, the structure of the system interconnector 90 may not be limited to this example, and in an embodiment, an additional data-exchanging element may be further provided to improve the efficiency in a data processing process.

As used herein, components described as being "electrically connected" are configured such that an electrical signal can be transferred from one component to the other (although such electrical signal may be attenuated in strength as it transferred and may be selectively transferred).

Figure 2:
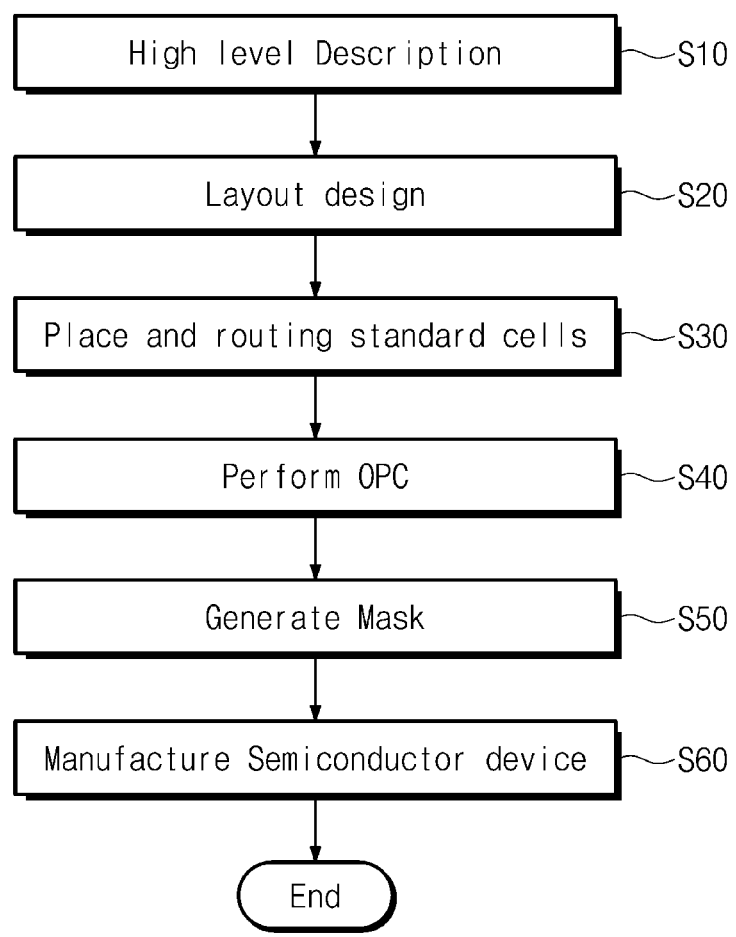
FIG. 2 is a flow chart illustrating a method of designing and fabricating a semiconductor device, according to an embodiment of the inventive concept.

FIG. 2 is a flow chart illustrating a method of designing and fabricating a semiconductor device, according to an embodiment of the inventive concept.

Referring to FIG. 2, a high-level design process may be performed on a semiconductor integrated circuit using the computer system described with reference to FIG. 1 (in S10). For example, in the high-level design process, an integrated circuit, which is a target object in a design process, may be described in terms of a high-level computer language. In an embodiment, the C language may be an example of the high-level computer language. Circuits designed by the high-level design process may be more concretely/specifically described by a register-transfer-level (RTL) coding or a simulation. Furthermore, codes generated by the RTL coding may be converted into a netlist, and the results may be combined to describe the entirety of the semiconductor device. The combined schematic circuit may be verified by a simulation tool, and in certain cases, an adjusting step may be further performed in consideration of a result of the verification step.

A layout design step may be performed to realize a logically-finalized form of the semiconductor integrated circuit on a silicon substrate (in S20). For example, the schematic circuit prepared in the high-level design process or the corresponding netlist may be referred during the layout design step. For example, the netlist may be descriptions of connectivity of electronic circuits.

A cell library, which is used for the layout design step, may contain information on operation, speed, and power consumption of a standard cell. Most of the layout design tools may be configured to define a cell library, which is used to represent a gate-level circuit with a layout. Here, the layout may be prepared to define geometrical features (e.g., shapes, positions, or dimensions) of patterns, which are used to form transistors and metal lines to be actually integrated on a silicon substrate. For example, in order to actually form an inverter circuit on a silicon substrate, it may be necessary to properly place layouts for patterns (e.g., PMOS, NMOS, N-WELL, gate electrodes, and metal lines thereon). For this, a searching operation may be performed to choose the most suitable inverter layout from the inverter layouts which have been stored in the cell library.

Steps of placing and routing various standard cells, which are stored in the cell library, may be performed (in S30). For example, the standard cells may be two-dimensionally placed. Then, high-level lines or routing patterns may be placed on the placed standard cells. By performing the routing step, it may be possible to connect the placed standard cells to each other in the previously-designed manner. The steps of placing and routing the standard cells may be automatically executed by the placement and routing tool 34.

After the routing step, a verification step may be performed on the layout to check whether there is a portion violating the given design rule. In an embodiment, the verification step may include evaluating verification items, such as a design rule check (DRC), an electrical rule check (ERC), and a layout vs schematic (LVS). Here, the DRC may be performed to evaluate whether the layout meets the given design rule, the ERC may be performed to evaluate whether there is an electrical disconnection issue in the layout, and the LVS may be performed to evaluate whether the layout is prepared to coincide with the gate-level netlist. For example, the gate-level netlist may be a description of connectivity between patterns formed in the gate electrode layers and/or connectivity of patterns formed in the gate electrode layer with related elements.

An OPC step may be performed (in S40). In general, optical proximity effects may occur when a photolithography process using a photomask manufactured based on the designed layout is performed on a silicon wafer. The OPC step may be performed to correct the optical proximity or distortion issues in the photolithography process. For example, in the OPC step, the layout may be modified to reduce a difference in shape between designed patterns and actually-formed patterns, which is caused by the optical proximity effects or during an exposure step of the photolithography process. As a result of the OPC step, the designed shapes and positions of the layout patterns may be slightly changed or biased.

A photomask may be generated, based on the layout modified by the OPC step (in S50). In general, the photomask may be manufactured by patterning a chromium layer, which is formed on a glass substrate, in such a way to depict the layout pattern.

A semiconductor device may be fabricated using the manufactured photomask (in S60). In the actual fabricating process using the photomask, various exposing and etching steps may be performed or repeated to sequentially form patterns, which are defined in the layout design step, on a silicon substrate.

Figure 3:
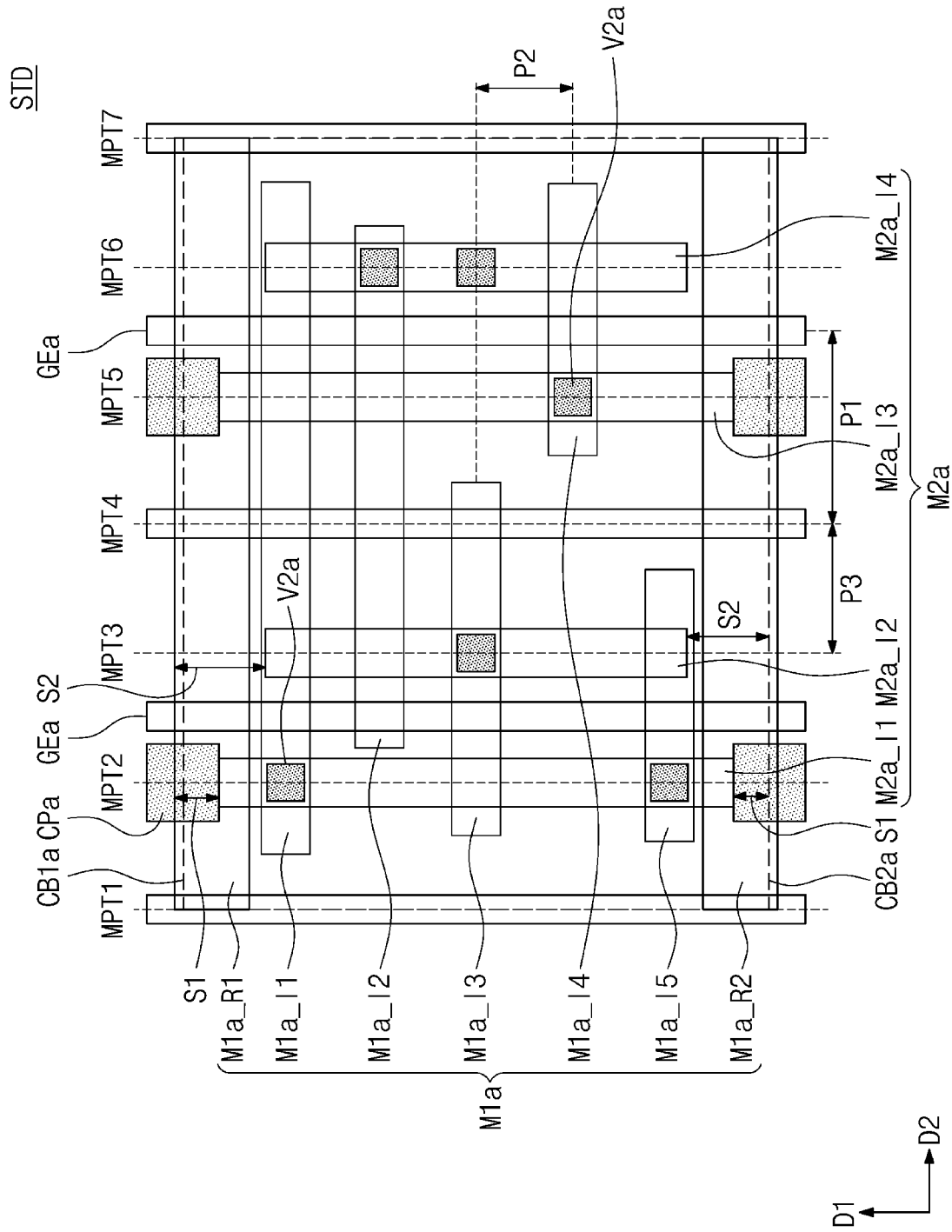
FIG. 3 is a layout of a standard cell designed through a layout design step of FIG. 2.

FIG. 3 is a layout of a standard cell designed through the layout design step S20 of FIG. 2. FIG. 3 exemplarily illustrates a standard cell STD for a single logic circuit. An example of the designed standard cell STD will be described exemplarily with reference to FIG. 3.

The standard cell STD may include gate patterns GEa, first interconnection patterns M1a, second interconnection patterns M2a, and via patterns V2a. Furthermore, the standard cell STD may further include other layout patterns (e.g., active regions, active contact patterns, and so forth). In order to reduce complexity in the drawings and to provide better understanding of the inventive concept, other layout patterns (e.g., active regions, active contact patterns, and so forth) in the standard cell STD shown in FIG. 3 may be omitted. In this disclosure, "interconnection pattern" and "interconnection line" may be interchangeably used.

The gate patterns GEa may extend in a first direction D1 and may be arranged (e.g., spaced apart) in a second direction D2, which is different from (e.g., orthogonal to) the first direction D1. The gate patterns GEa may be arranged with a first pitch P1, e.g., in the second direction D2. In the present specification, the term "pitch" may mean a distance between centers of two adjacent elements, e.g., in a predetermined direction. The gate patterns GEa may be used to define gate electrodes of transistors.

Figure 12A:
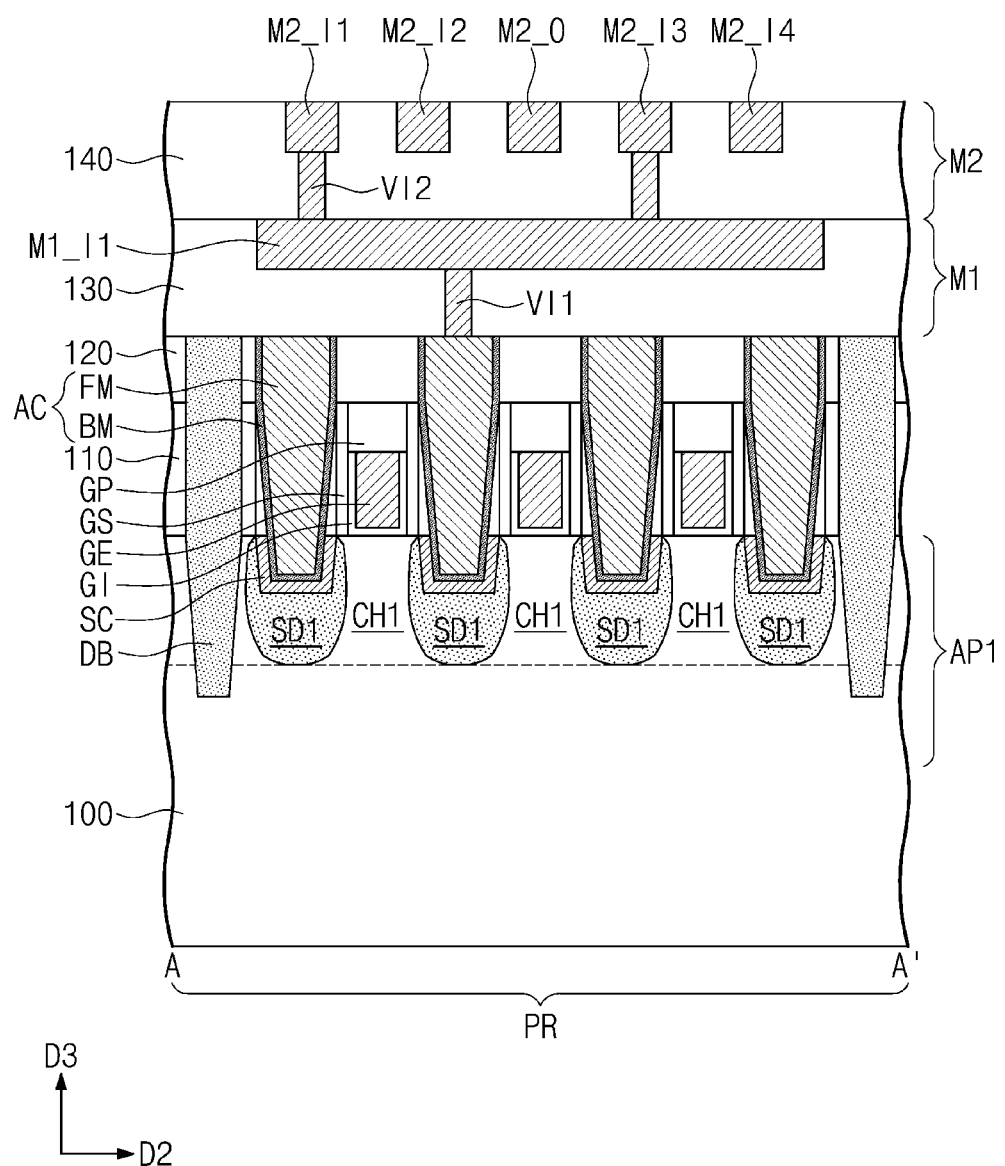
FIGS. 12A to 12D are sectional views which are respectively taken along lines A-A', B-B', C-C', and D-D' of FIG. 11.

The first interconnection patterns M1a may be placed at a higher level than the gate patterns GEa. The first interconnection patterns M1a may define a first metal layer (e.g., first interconnection lines M1 of FIG. 12A). For example, the first interconnection patterns M1a may include a first lower power pattern M1a_R1, a second lower power pattern M1a_R2, and first to fifth lower interconnection patterns Ma_I1 to M1a_I5.

The first lower power pattern M1a_R1, the second lower power pattern M1a_R2, and the first to fifth lower interconnection patterns M1a_I1 to M1a_I5 may be disposed on the same layer or at the same level. The first lower power pattern M1a_R1, the second lower power pattern M1a_R2, and the first to fifth lower interconnection patterns M1a I1 to M1a_I5 may extend in the second direction D2 to be parallel to each other.

The first lower power pattern M1a_R1 and the second lower power pattern M1a_R2 may extend to cross the standard cell STD. Between the first lower power pattern M1a_R1 and the second lower power pattern M1a_R2, the first to fifth lower interconnection patterns M1a_I1 to M1a_I5 may be arranged (e.g., spaced apart) in the first direction D1. The first to fifth lower interconnection patterns M1a_I1 to M1a_I5 may be arranged with a second pitch P2, e.g., in the first direction D1. The second pitch P2 may be smaller than the first pitch P1.

A linewidth of each of the first and second lower power patterns M1a_R1 and M1a_R2 may be larger than a linewidth of each of the first to fifth lower interconnection patterns M1a_I1 to M1a_I5. The first and second lower power patterns M1a_R1 and M1a_R2 may have a relatively large linewidth, and in this case, it may be beneficial to reduce electric resistance of interconnection lines.

The second interconnection patterns M2a may be placed at a higher level than the first interconnection patterns M1a. The second interconnection patterns M2a may define a second metal layer (e.g., second interconnection lines M2 of FIG. 12A). In the layout of the standard cell STD before the routing step, the second interconnection patterns M2a may include first to fourth upper interconnection patterns M2a_I1 to M2a_I4. The first to fourth upper interconnection patterns M2a_I1 to M2a_I4 may extend in the first direction D1 to be parallel to each other. The first to fourth upper interconnection patterns M2a_I1 to M2a_4 may be parallel to the gate patterns GEa.

First to seventh interconnection tracks MPT1 to MPT7 may be imaginary lines which are used to dispose the second interconnection patterns M2a in the standard cell STD, e.g., in a plan view. The first to seventh interconnection tracks MPT1 to MPT7 may extend in the first direction D1. For example, the first upper interconnection pattern M2a_I1 may be disposed on the second interconnection track MPT2. A center of the first upper interconnection pattern M2a_I1 may be aligned to (e.g., overlap/coincide with) the second interconnection track MPT2. The second upper interconnection pattern M2a_I2 may be disposed on the third interconnection track MPT3. A center of the second upper interconnection pattern M2a_I2 may be aligned to (e.g., overlap/coincide with) the third interconnection track MPT3. The third upper interconnection pattern M2a_I3 may be disposed on the fifth interconnection track MPT5. A center of the third upper interconnection pattern M2a_I3 may be aligned to (e.g., overlap/coincide with) the fifth interconnection track MPT5. The fourth upper interconnection pattern M2a_I4 may be disposed on the sixth interconnection track MPT6. A center of the fourth upper interconnection pattern M2a_I4 may be aligned to (e.g., overlap/coincide with) the sixth interconnection track MPT6.

The first to seventh interconnection tracks MPT1 to MPT7 may be arranged in the second direction D2 and may be spaced apart from each other with a third pitch P3, e.g., in the second direction D2. The third pitch P3 may be smaller than the first pitch P1. The third pitch P3 may be larger than the second pitch P2.

At least one of the first to seventh interconnection tracks MPT1 to MPT7 may be aligned to (e.g., overlap/coincide with) a center of the gate pattern GEa. For example, the center of the gate pattern GEa may be aligned to (e.g., overlap/coincide with) the fourth interconnection track MPT4.

A first cell border CB1a and a second cell border CB2a, which are opposite to each other in the first direction D1, may be defined in the standard cell STD. For example, the first and second cell borders CB1a and CB2a may be defined at opposite ends of the standard cell STD in the first direction D1. The first and second cell borders CB1a and CB2a may extend in the second direction D2. The first lower power pattern M1a_R1 may be disposed on the first cell border CB1a. The second lower power pattern M1a_R2 may be disposed on the second cell border CB2a.

A distance between the first upper interconnection pattern M2a_I1 and the first cell border CB1a and a distance between the first upper interconnection pattern M2a_I1 and the second cell border CB2a may be the same and may have a first distance S1. A distance between the second upper interconnection pattern M2a_I2 and the first cell border CB1a and a distance between the second upper interconnection pattern M2a_I2 and the second cell border CB2a may be the same and may have a second distance S2. The first distance S1 may be smaller than the second distance S2.

A cutting pattern CPa may be placed near an end portion of the first upper interconnection pattern M2a_I1. As will be described below, the cutting pattern CPa may be formed when a distance between adjacent ones of the upper interconnection patterns on a single interconnection track is smaller than a predetermined distance. For example, the cutting pattern CPa may be formed when a tip-to-tip distance/space between upper interconnection patterns is smaller than a direct patterning resolution of a photolithography process forming the upper interconnection pattern M2a. The cutting pattern CPa may vertically overlap with one of the first or second lower power pattern M1a_R1 or M1a_R2.

The via patterns V2a may be placed at intersections of the first and second interconnection patterns M1a and M2a, e.g., in a plan view. For example, the via patterns V2a may be placed where the first interconnection patterns M1a vertically overlap the second interconnection patterns M2a. The via patterns V2a may define vias, which are used to vertically connect the first interconnection line (e.g., the first interconnection pattern M1a) to the second interconnection line (e.g., the second interconnection pattern M2a). In an embodiment, the via patterns V2a, in conjunction with the second interconnection patterns M2a, may define the second metal layer.

Figure 4:
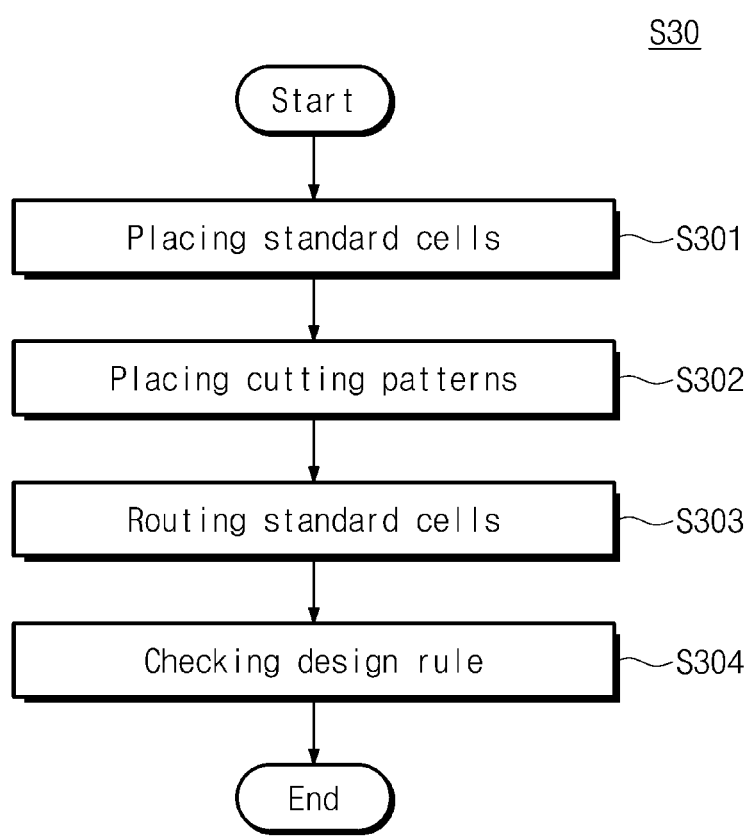
FIG. 4 is a flow chart illustrating steps of placing and routing standard cells of FIG. 2.
Figure 5:
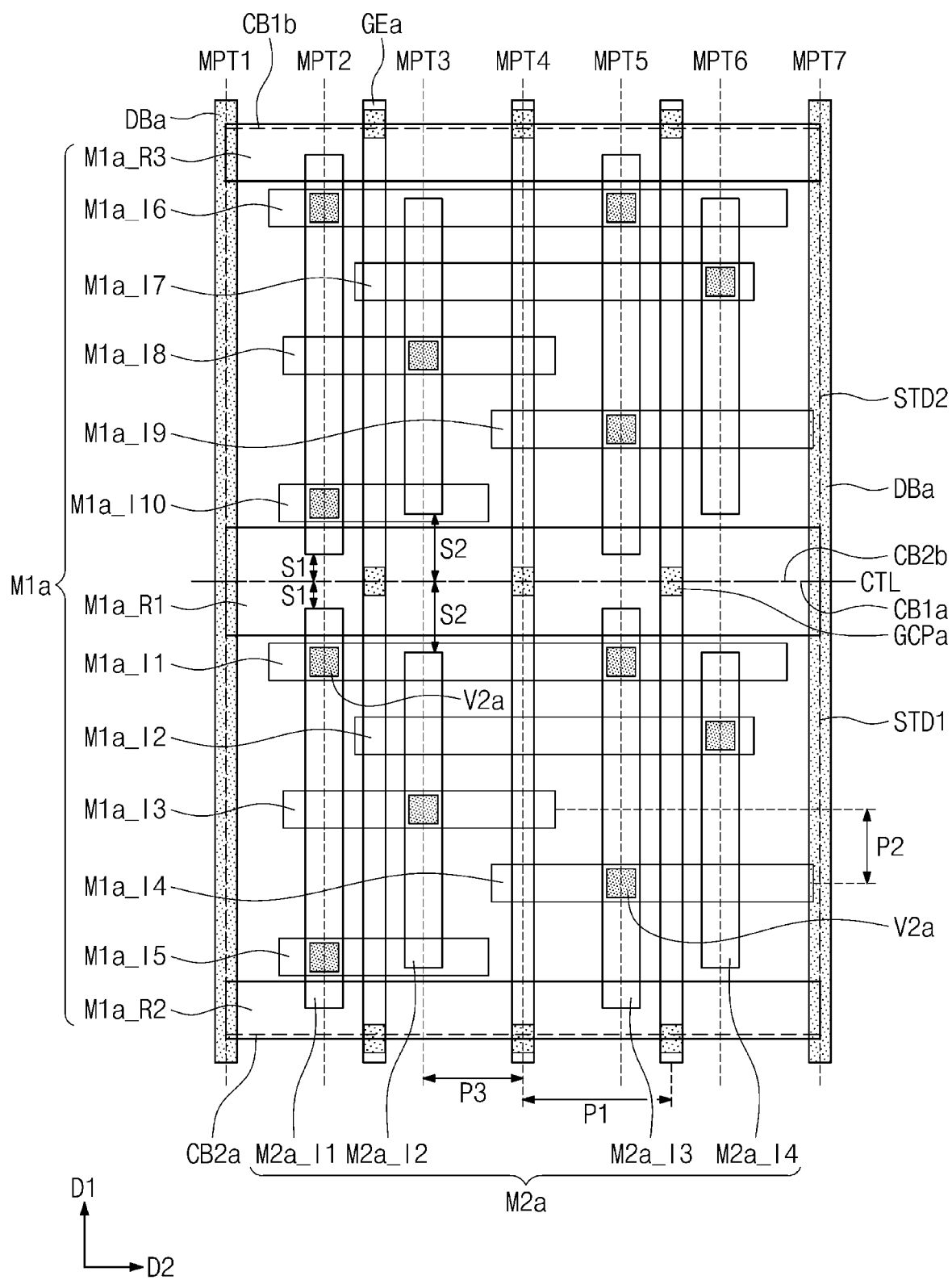
FIGS. 5 to 7 are plan views illustrating steps of placing and routing the standard cells shown in FIG. 4.
Figure 6:
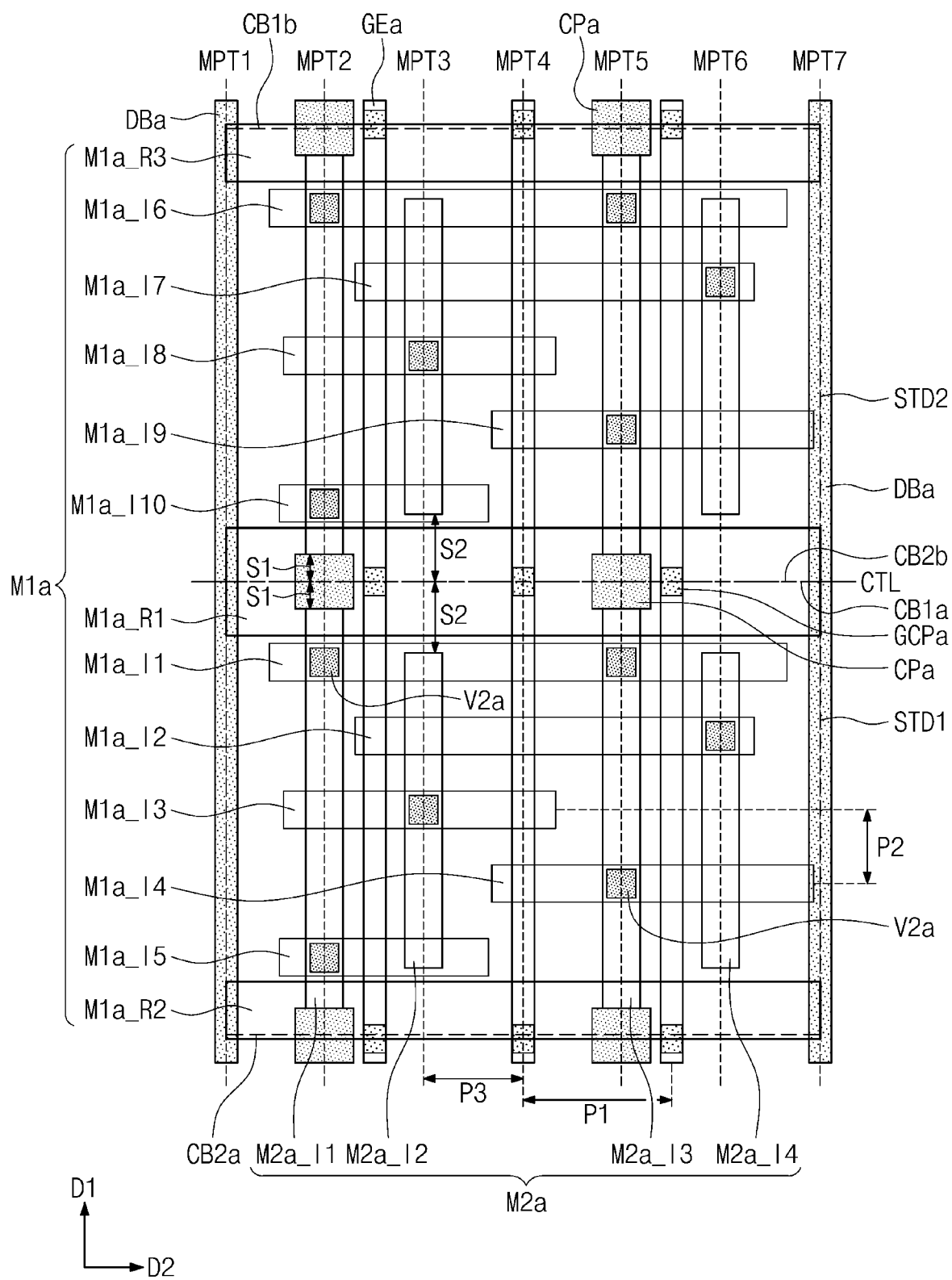
Figure 7:
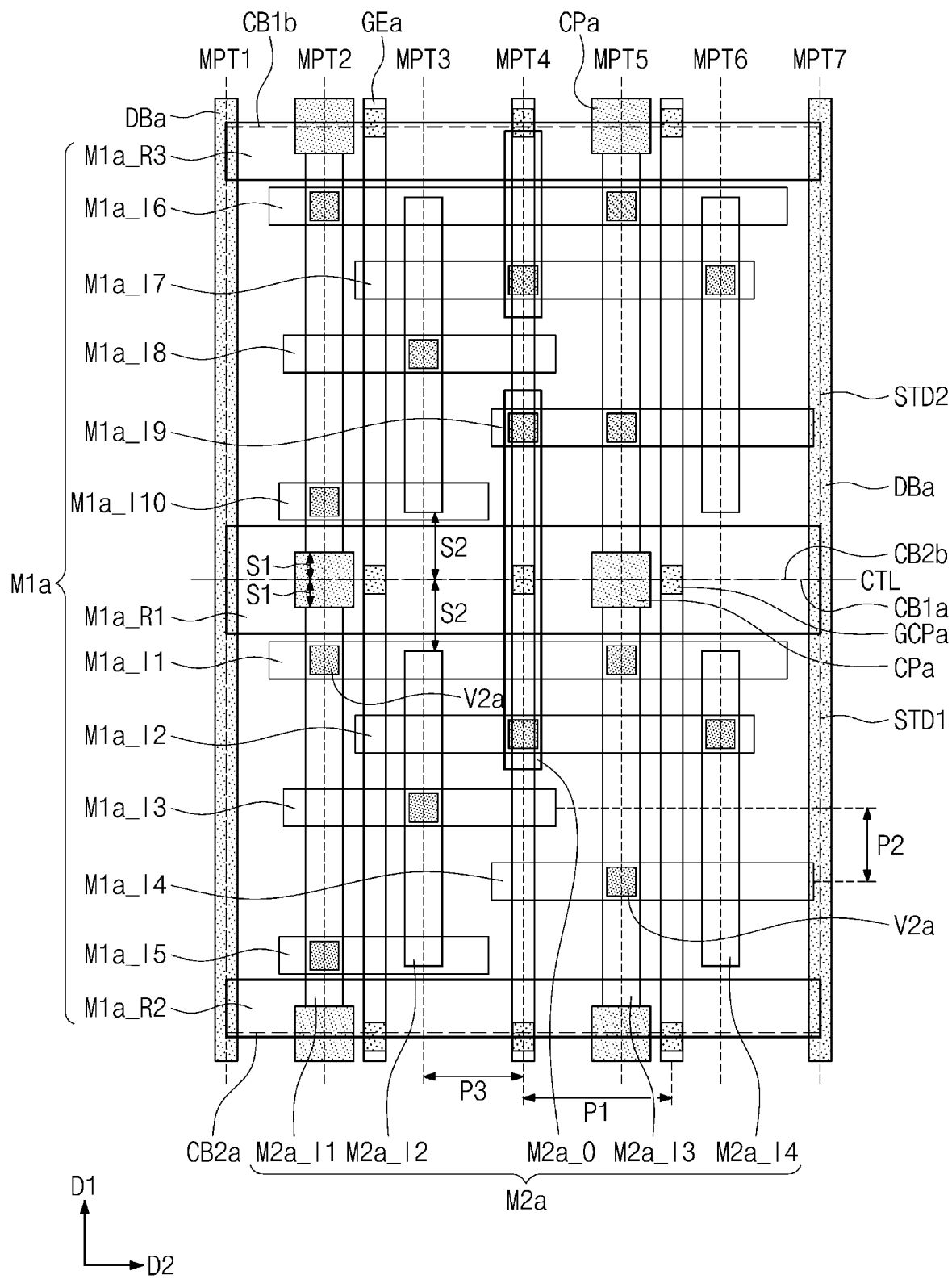

FIG. 4 is a flow chart illustrating the steps S30 of placing and routing standard cells of FIG. 2. FIGS. 5 to 7 are plan views illustrating steps of placing and routing the standard cells shown in FIG. 4.

Referring to FIGS. 4 and 5, the gate patterns GEa extending in the first direction D1 may be arranged in the second direction D2. The gate patterns GEa may be spaced apart from each other with the first pitch P1, e.g., in the second direction D2.

The first to seventh interconnection tracks MPT1 to MPT7 may be defined. The first to seventh interconnection tracks MPT1 to MPT7 may extend in the first direction D1 to be parallel to each other. The first to seventh interconnection tracks MPT1 to MPT7 may be arranged in the second direction D2 and may be spaced apart from each other with the third pitch P3 in the second direction D2.

Some of the first to seventh interconnection tracks MPT1 to MPT7 may overlap with the gate patterns GEa. For example, the fourth interconnection track MPT4 may overlap and extend along the center of the gate pattern GEa.

Next, standard cells may be placed (in S301). For example, first and second standard cells STD1 and STD2 may be placed in the first direction D1. The first and second standard cells STD1 and STD2 may be adjacent to each other in the first direction D1. Each of the first and second standard cells STD1 and STD2 may be the standard cell STD previously described with reference to FIG. 3.

A pair of division patterns DBa may be disposed at both sides of each of the first and second standard cells STD1 and STD2. For example, the gate patterns GEa at both sides of the first and second standard cells STD1 and STD2 may be replaced with the division patterns DBa. The first and seventh interconnection tracks MPT1 and MPT7 may respectively overlap and extend along centers of the division patterns DBa.

The first and second cell borders CB1a and CB2a, which are opposite to each other in the first direction D1, may be defined in the first standard cell STD1. For example, the first and second cell borders CB1a and CB2a may be defined at opposite ends of the first standard cell STD1 in the first direction D1. The first and second cell borders CB1a and CB2a of the first standard cell STD1 may extend in the second direction D2. A first cell border CB1b and a second cell border CB2b, which are opposite to each other in the first direction D1, may be defined in the second standard cell STD2. For example, the first and second cell borders CB1b and CB2b may be defined at opposite ends of the second standard cell STD2 in the first direction D1. The first and second cell borders CB1b and CB2b of the second standard cell STD2 may extend in the second direction D2. The first cell border CB1a of the first standard cell STD1 may be substantially the same as the second cell border CB2b of the second standard cell STD2. For example, the first and second standard cells STD1 and STD2 may share a single cell border.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The first lower power pattern M1a_R1 may be disposed on the first cell border CB1a of the first standard cell STD1. The second lower power pattern M1a_R2 may be disposed on the second cell border CB2a of the first standard cell STD1. A third lower power pattern M1a_R3 may be disposed on the first cell border CB1b of the second standard cell STD2. A center line CTL of the first lower power pattern M1a_R1 parallel to the second direction D2 may overlap/ coincide with the first cell border CB1a of the first standard cell STD1.

The first to fifth lower interconnection patterns M1a_I1 to M1a_I5 may be disposed on the first standard cell STD1. The sixth to tenth lower interconnection patterns M1a_I6 to M1a_I10 may be disposed on the second standard cell STD2. The first to tenth lower interconnection patterns M1a_I1 to M1a_I10 and the first to third lower power patterns M1a_R1 to M1a_R3 may constitute the first interconnection patterns M1a. The first interconnection patterns M1a may define a first metal layer (e.g., the first interconnection lines M1).

The first upper interconnection pattern M2a_I1 may be disposed on the second interconnection track MPT2. The second upper interconnection pattern M2a_I2 may be disposed on the third interconnection track MPT3. The third upper interconnection pattern M2a_I3 may be disposed on the fifth interconnection track MPT5. The fourth upper interconnection pattern M2a_I4 may be disposed on the sixth interconnection track MPT6.

Gate cutting patterns GCPa may be interposed between the gate patterns GEa. The gate cutting patterns GCPa may be provided to divide a single gate pattern GEa into a plurality of gate patterns GEa. The gate cutting patterns GCPa may be disposed on the first cell border CB1a of the first standard cell STD1, the second cell border CB2a of the first standard cell STD1, and the first cell border CB1b of the second standard cell STD2.

A distance from the first upper interconnection pattern M2a_I1 on the first standard cell STD1 to the center line CTL may be a first distance S1. The first upper interconnection pattern M2a_I1 on the first standard cell STD1 may be described as a first upper interconnection pattern M2a_I1 of the first standard cell STD1. A distance from the first upper interconnection pattern M2a_I1 on the second standard cell STD2 to the center line CTL may be the first distance S1. The first upper interconnection pattern M2a_I1 on the second standard cell STD1 may be described as a first upper interconnection pattern M2a_I1 of the second standard cell STD1. For example, the center line CTL may overlap a center point between the first upper interconnection patterns M2a_I1 of the first and second standard cells STD1 and STD2 in a plan view. A distance from the second upper interconnection pattern M2a_I2 on the first standard cell STD1 to the center line CTL may be a second distance S2. The second upper interconnection pattern M2a_I2 on the first standard cell STD1 may be described as a second upper interconnection pattern M2a_I2 of the first standard cell STD1. A distance from the second upper interconnection pattern M2aI2 on the second standard cell STD2 to the center line CTL may be the second distance S2. The second upper interconnection pattern M2a_I2 on the second standard cell STD2 may be described as a second upper interconnection pattern M2a_I2 of the second standard cell STD2. For example, the center line CTL may overlap a center point between the second upper interconnection patterns M2a_I2 of the first and second standard cells STD1 and STD2 in a plan view. The first distance S1 may be smaller than the second distance S2. For example, a gap between the first upper interconnection patterns M2a_I1 of the first and second standard cells STD1 and STD2 may be less than a gap between the second upper interconnection patterns M2a_I2 of the first and second standard cells STD1 and STD2. The standard cells including the first and second standard cells STD1 and STD2 of the disclosure may be logic cells.

An end portion of the first upper interconnection pattern M2a_I1 may vertically overlap with at least one of the lower power patterns M1a_R1, M1a_R2, and M1a_R3. An end portion of the second upper interconnection pattern M2aI2 may not vertically overlap with the lower power patterns M1a_R1, M1a_R2, and M1a_R3. In certain embodiments, the end portion of the second upper interconnection pattern M2aI2 may vertically overlap with at least one of the lower power patterns M1a_R1, M1a_R2, and M1a_R3.

Referring to FIGS. 4 and 6, the cutting patterns CPa may be placed (in S302). Each of the cutting patterns CPa may vertically overlap with at least one of the lower power patterns M1a_R1, M1a_R2, and M1a_R3. In the case where a distance between the upper interconnection patterns, which are placed to be adjacent to each other on a single interconnection track, on the first and second standard cells STD1 and STD2 is smaller than a predetermined distance, e.g., a photolithography resolution distance, the cutting pattern CPa may be placed. In an embodiment, the predetermined distance may be a sum of the first distance S1 and the second distance S2.

The cutting pattern CPa may be disposed on the first cell border CB1a of the first standard cell STD1, the second cell border CB2a of the first standard cell STD1, and the first cell border Cb1b of the second standard cell STD2.

The cutting pattern CPa may be disposed between the first upper interconnection pattern M2a_I1 of the first standard cell STD1 and the first upper interconnection pattern M2a_I1 of the second standard cell STD2. The cutting pattern CPa may be disposed on the second interconnection track MPT2. A linewidth of the cutting pattern CPa may be two times the first distance S1. The cutting pattern CPa may be adjacent to an end portion of the first upper interconnection pattern M2a_I1.

The cutting pattern CPa may not be placed on the third interconnection track MPT3 adjacent to the second interconnection track MPT2. Even when the standard cell is shrunken, a portion of an upper interconnection pattern should extend for an electric connection between the upper and lower interconnection patterns. Here, it may be necessary to place a cutting pattern, which is used to form a tip-to-tip structure, between the upper interconnection patterns. For example, the tip-to-tip structure may be a structure in which a cutting pattern is formed between two tips adjacent conductor patterns. For example, the two tips of the tip-to-tip structure may contact the cutting pattern disposed therebetween. According to an embodiment of the inventive concept, the upper interconnection patterns may be designed such that the cutting pattern CPa is placed on an interconnection track but is not placed on another interconnection track near such an interconnection track, e.g., directly adjacent interconnection track to the interconnection track on which the cutting pattern CPa is placed.

However, according to the conventional technology, a first cutting pattern may be placed between the first upper interconnection pattern M2a_I1 on the first standard cell STD1 and the first upper interconnection pattern M2a_I1 on the second standard cell STD2, and it is necessary to place a second cutting pattern between the second upper interconnection pattern M2a_2 on the first standard cell STD1 and the second upper interconnection pattern M2a_I2 on the second standard cell STD2, because a distance between the second upper interconnection pattern M2a_I2 on the first standard cell STD1 and the second upper interconnection pattern M2a_I2 on the second standard cell STD2 is smaller than the sum of the first and second distances S1 and S2. Here, a distance between the first and second cutting patterns may be too small to form the second cutting pattern using a single mask pattern. Thus, it is necessary to form not only a first mask pattern for forming the first cutting pattern but also a second mask pattern for forming the second cutting pattern. By contrast, according to an embodiment of the inventive concept, the second mask pattern for forming the second cutting pattern may be unnecessary. Thus, it may be possible to reduce the number of steps requiring a mask, in a process of fabricating a semiconductor device. For example, by forming the tip-to-tip structure, it may be possible to improve reliability of the semiconductor device, and furthermore, it may be possible to reduce cost for a process of fabricating the semiconductor device.

Referring to FIGS. 4 and 7, a routing operation on the standard cells may be performed (in S303). For example, the routing of the first and second standard cells STD1 and STD2 may include placing routing patterns M2a_O. The routing patterns M2a_O may electrically connect the standard cells to each other as designed.

In an embodiment, the routing patterns M2a_O may be placed on the fourth interconnection track MPT4. The routing patterns M2a_O and the first to fourth upper interconnection patterns M2a_I1 to M2a_I4 may constitute the second interconnection patterns M2a. The second interconnection patterns M2a may define the second metal layer (e.g., the second interconnection lines M2).

After the placing of the routing patterns M2a_O, a design rule may be checked (in S304). For example, to determine whether there is a portion violating a design rule, a verification step may be performed on the layout. In some embodiments, the verification step may include evaluating verification items, such as a design rule check (DRC), an electrical rule check (ERC), and a layout vs schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

If the steps of placing and routing the standard cells described with reference to FIGS. 4 to 7 are finished, an OPC process may be performed on a designed layout and then, a photomask may be manufactured. A semiconductor device may be fabricated by a semiconductor fabrication process using the manufactured photomask (e.g., see FIG. 1).

Figure 8:
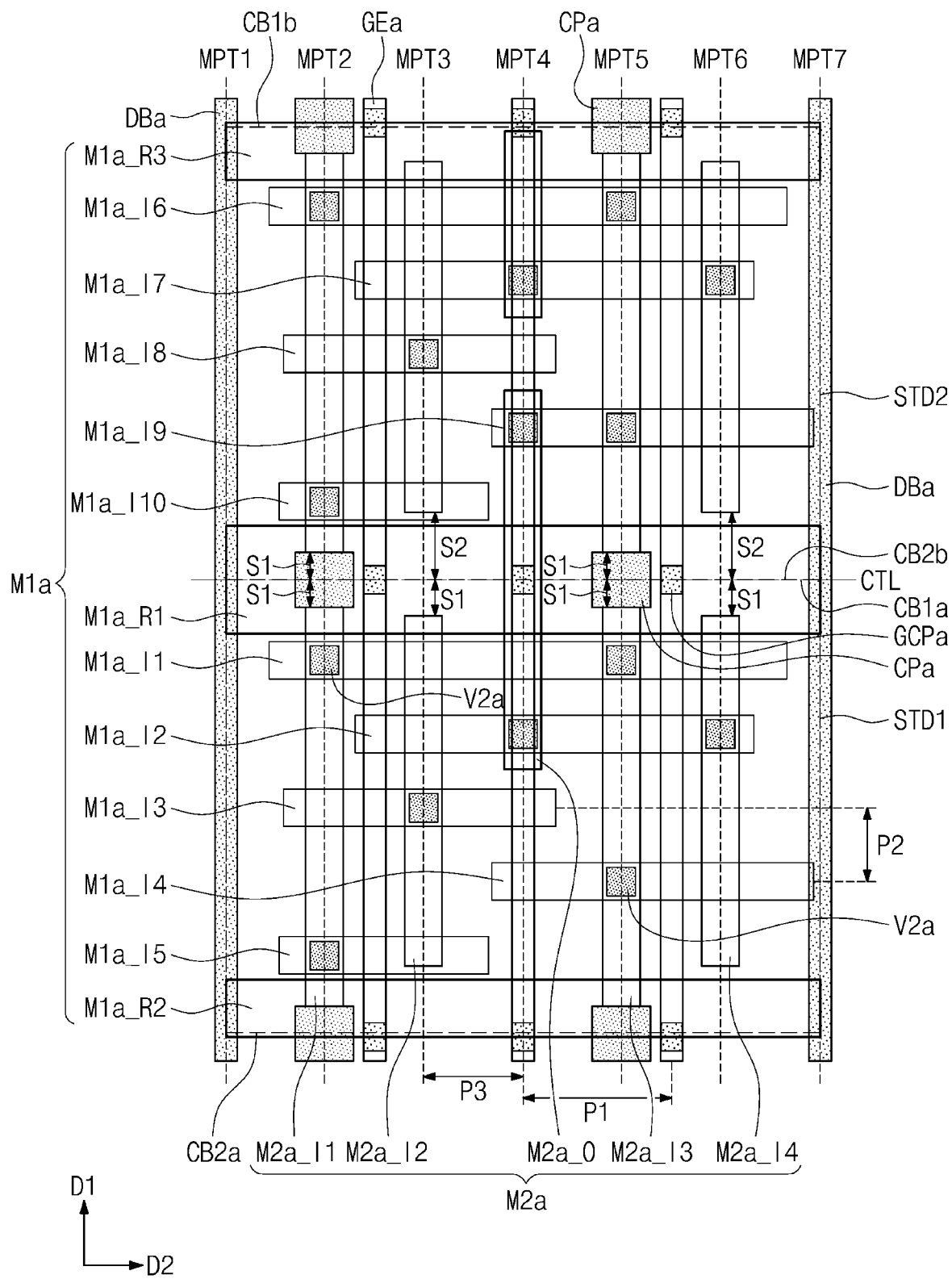
FIGS. 8 to 10 are plan views, each of which illustrates a layout of a semiconductor device according to an embodiment of the inventive concept.
Figure 9:
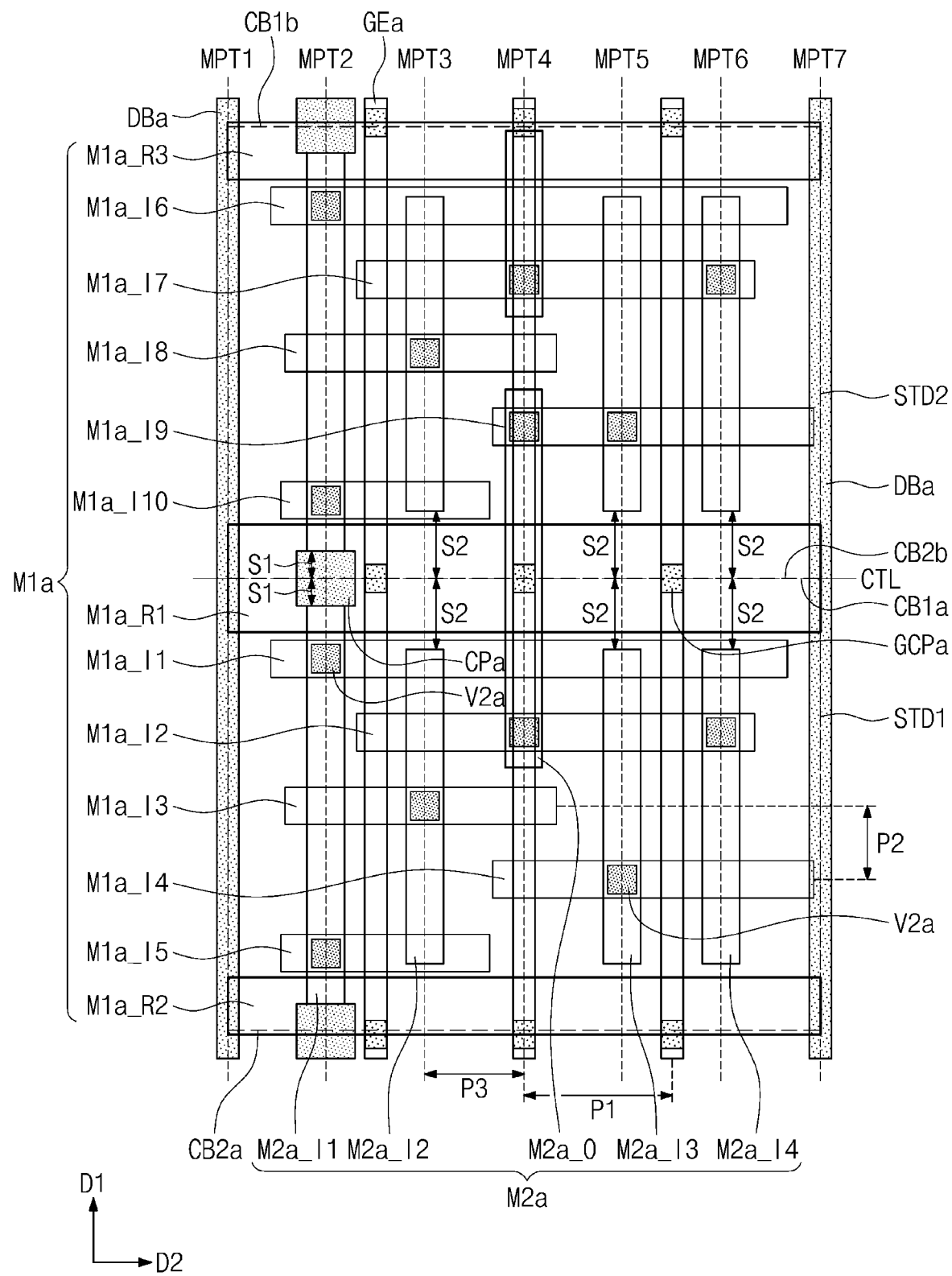
Figure 10:
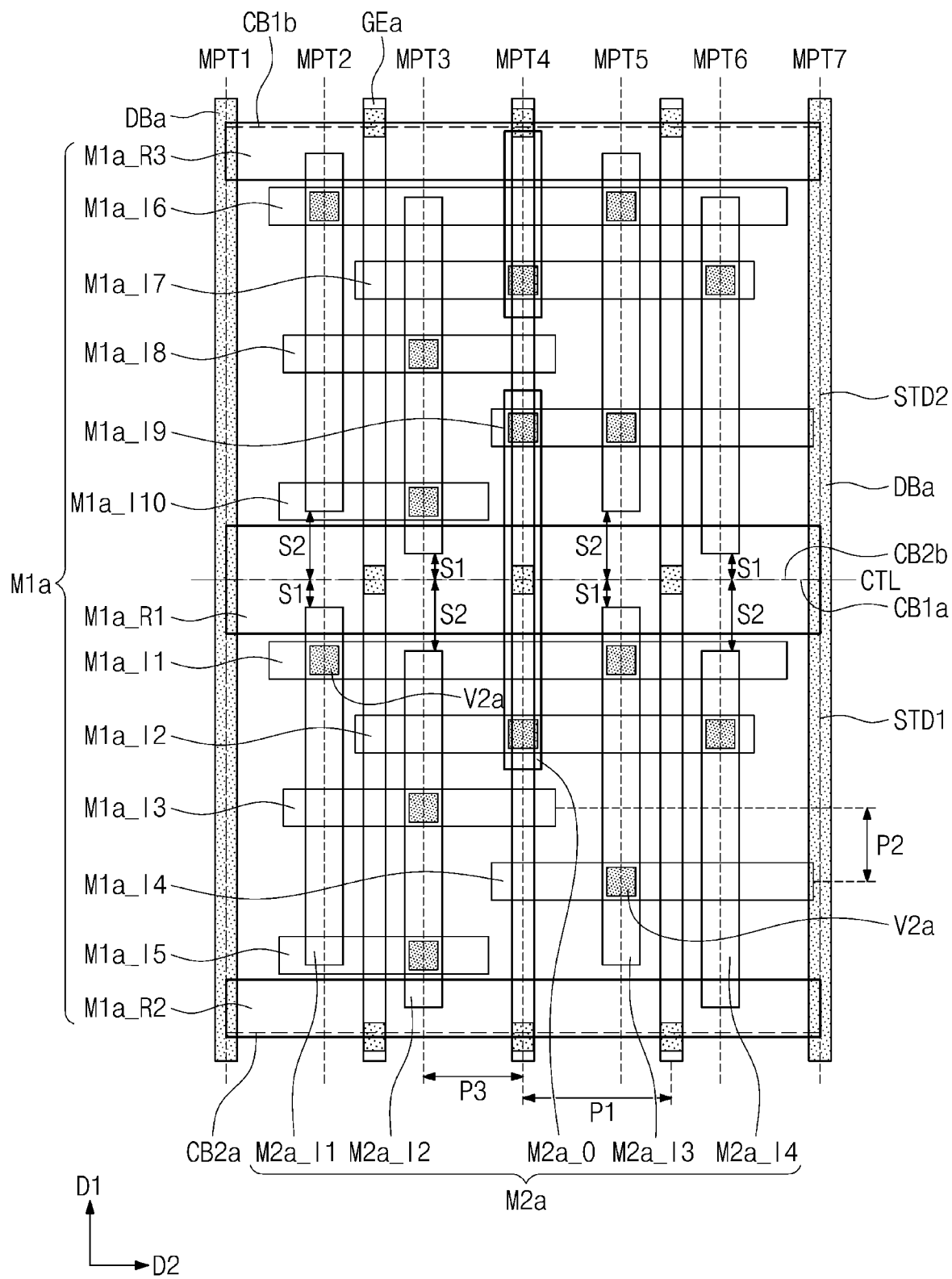

FIGS. 8 to 10 are plan views, each of which illustrates a layout of a semiconductor device according to an embodiment of the inventive concept. For concise description, elements previously described with reference to FIGS. 4 to 7 may be identified by the same reference numbers without repeating overlapping descriptions thereof.

Referring to FIG. 8, a distance from the second upper interconnection pattern M2a_I2 on the first standard cell STD1 to the center line CTL may be a first distance S1. A distance from the second upper interconnection pattern M2a_I2 on the second standard cell STD2 to the center line CTL may be a second distance S2. A distance between the second upper interconnection pattern M2a_I2 on the first standard cell STD1 and the second upper interconnection pattern M2a_I2 on the second standard cell STD2 may be a sum of the first and second distances S1 and S2. The cutting pattern CPa may not be disposed on the third interconnection track MPT3. The sum of the first and second distances S1 and S2 may be the smallest/shortest distance between adjacent ones of the upper interconnection patterns, at which the cutting pattern CPa is unnecessary.

Referring to FIG. 9, a distance from the third upper interconnection pattern M2a_I3 on the first standard cell STD1 to the center line CTL may be a second distance S2. A distance from the third upper interconnection pattern M2a_I3 on the second standard cell STD2 to the center line CTL may be the second distance S2. A distance from the fourth upper interconnection pattern M2a_I4 on the first standard cell STD1 to the center line CTL may be the second distance S2. A distance from the fourth upper interconnection pattern M2a_I4 on the second standard cell STD2 to the center line CTL may be the second distance S2.

The cutting pattern CPa may not be disposed on the fifth interconnection track MPT5 and the sixth interconnection track MPT6. For example, the cutting pattern CPa may be disposed neither on the fifth interconnection track MPT5 nor on the sixth interconnection track MPT6 adjacent to the fifth interconnection track MPT5.

Referring to FIG. 10, a distance from the first upper interconnection pattern M2a_I1 on the first standard cell STD1 to the center line CTL may be a first distance S1. A distance from the first upper interconnection pattern M2a_I1 on the second standard cell STD2 to the center line CTL may be a second distance S2. The cutting pattern CPa may not be disposed on the second interconnection track MPT2.

A distance from the second upper interconnection pattern M2a_I2 on the first standard cell STD1 to the center line CTL may be the second distance S2. A distance from the second upper interconnection pattern M2a_I2 on the second standard cell STD2 to the center line CTL may be the first distance S1. The cutting pattern CPa may not be disposed on the third interconnection track MPT3.

The cutting pattern CPa may not be disposed on the fifth interconnection track MPT5 and the sixth interconnection track MPT6. In the present embodiment, the cutting pattern CPa may not be disposed on the first standard cell STD1 and the second standard cell STD2. This may be because a distance between upper interconnection patterns, which are adjacent to each other on a single interconnection track, is equal to or larger than the sum of the first and second distances S1 and S2. Thus, a process of forming the cutting patterns CPa may be omitted. As a result, it may be possible to simplify a process of fabricating a semiconductor device.

Figure 11:
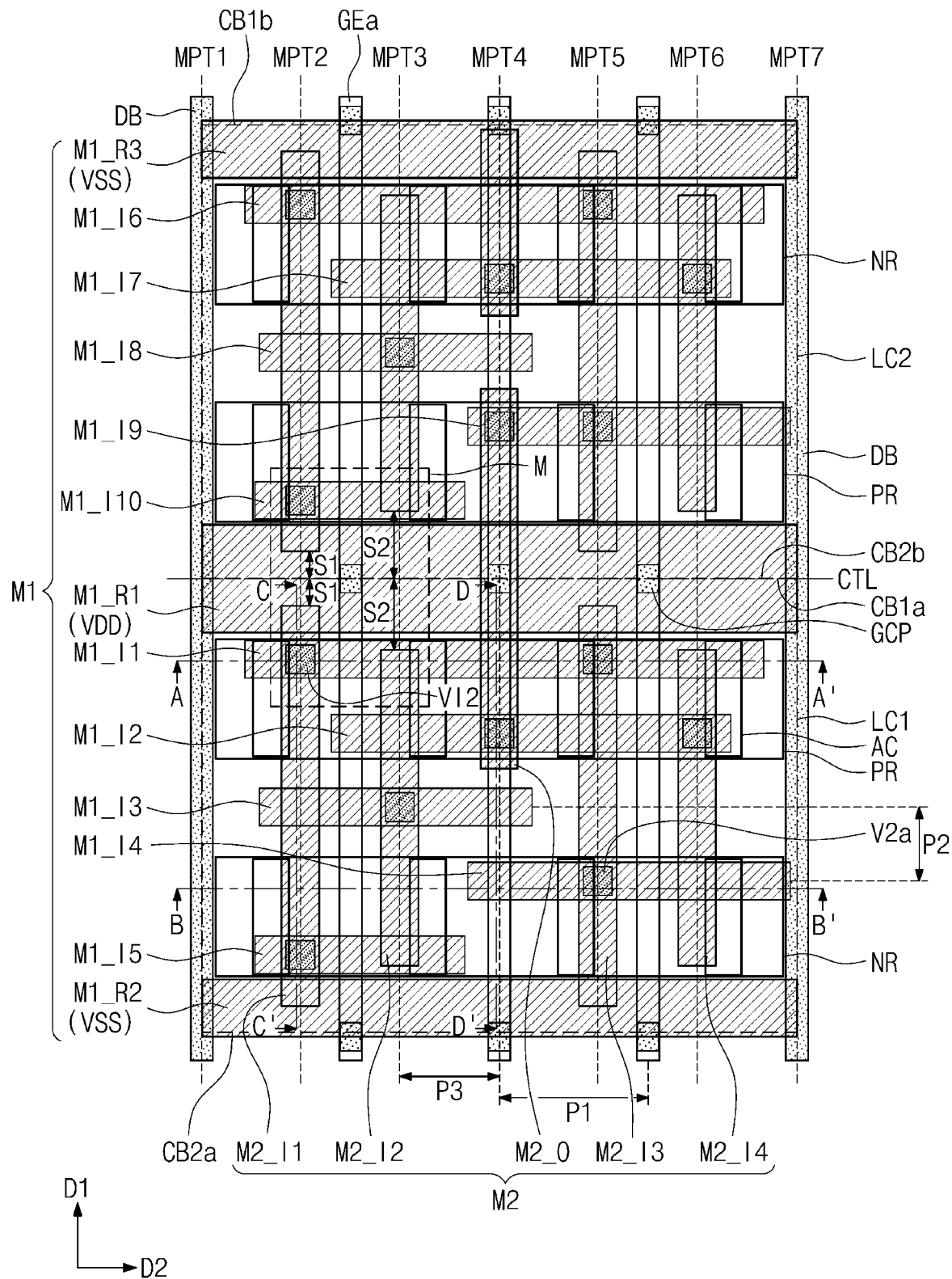
FIG. 11 is a plan view illustrating a semiconductor device according to an embodiment of the inventive concept.

FIG. 11 is a plan view illustrating a semiconductor device according to an embodiment of the inventive concept. FIGS. 12A to 12D are sectional views which are respectively taken along lines A-A', B-B', C-C', and D-D' of FIG. 11. FIG. 13 is an enlarged plan view of a region M of FIG. 11. The semiconductor device shown in FIGS. 11 and 12A to 12D is an example of a semiconductor device that is realized on an actual substrate using the layout of FIG. 7.

Referring to FIGS. 11 and 12A to 12D, a first logic cell LC1 and a second logic cell LC2 may be provided on a substrate 100. Logic transistors constituting a logic circuit may be disposed on the first and second logic cells LC1 and LC2.

The substrate 100 may include a first active region PR and a second active region NR. In an embodiment, the first active region PR may be a PMOSFET region, and the second active region NR may be an NMOSFET region. The substrate 100 may be a semiconductor substrate that is formed of or includes silicon, germanium, silicon-germanium, a compound semiconductor material, or the like. In an embodiment, the substrate 100 may be a silicon wafer.

The first and second active regions PR and NR may be defined by a second trench TR2, which is formed in an upper portion of the substrate 100. The second trench TR2 may be located between the first and second active regions PR and NR. The first and second active regions PR and NR may be spaced apart from each other, in the first direction D1, with the second trench TR2 interposed therebetween. Each of the first and second active regions PR and NR may extend in the second direction D2 that is different from (e.g., perpendicular to) the first direction D1.

First active patterns AP1 and second active patterns AP2 may be provided on the first active region PR and the second active region NR, respectively. The first and second active patterns AP1 and AP2 may extend in the second direction D2 to be parallel to each other. Each of the first and second active patterns AP1 and AP2 may be a vertically-protruding portion of the substrate 100. A first trench TR1 may be defined between adjacent ones of the first active patterns AP1 and between adjacent ones of the second active patterns AP2. The first trench TR1 may be shallower than the second trench TR2. For example, bottom surfaces of first trenches TR1 may be at a higher vertical level than bottom surfaces of second trenches TR2.

A device isolation layer ST may be provided to fill the first and second trenches TR1 and TR2. The device isolation layer ST may be formed of or include silicon oxide. Upper portions of the first and second active patterns AP1 and AP2 may protrude vertically above the device isolation layer ST (e.g., see FIG. 12D). Each of the upper portions of the first and second active patterns AP1 and AP2 may be a fin-shaped pattern, e.g., forming a FinFET. The device isolation layer ST may not cover the upper portions of the first and second active patterns AP1 and AP2. The device isolation layer ST may cover/contact lower side surfaces of the first and second active patterns AP1 and AP2.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Other words used to describe the relationship between elements should be interpreted in a like fashion (e.g., "between" versus "directly between," "adjacent" versus "directly adjacent," etc.).

First source/drain patterns SD1 may be provided in the upper portions of the first active patterns AP1. The first source/drain patterns SD1 may be impurity regions of a first conductivity type (e.g., p-type). A first channel pattern CH1 may be interposed between each pair of the first source/drain patterns SD1. Second source/drain patterns SD2 may be provided in the upper portions of the second active patterns AP2. The second source/drain patterns SD2 may be impurity regions of a second conductivity type (e.g., n-type). A second channel pattern CH2 may be interposed between each pair of the second source/drain patterns SD2.

The first and second source/drain patterns SD1 and SD2 may be epitaxial patterns, which are formed by a selective epitaxial growth process. In an embodiment, the first and second source/drain patterns SD1 and SD2 may have top surfaces that are coplanar with top surfaces of the first and second channel patterns CH1 and CH2. Alternatively, the top surfaces of the first and second source/drain patterns SD1 and SD2 may be higher than the top surfaces of the first and second channel patterns CH1 and CH2.

The first source/drain patterns SD1 may be formed of or include a semiconductor material (e.g., SiGe) having a lattice constant greater than that of the substrate 100. In this case, the first source/drain patterns SD1 may exert a compressive stress on the first channel patterns CH1. The second source/drain patterns SD2 may be formed of or include the same semiconductor material (e.g., Si) as the substrate 100.

Gate electrodes GE may be provided to cross the first and second active patterns AP1 and AP2 and to extend in the first direction D1. The gate electrodes GE may be arranged to be spaced apart from each other with a first pitch P1 in the second direction D2. The gate electrodes GE may vertically overlap with the first and second channel patterns CH1 and CH2. Each of the gate electrodes GE may be provided to face a top surface and opposite side surfaces of each of the first and second channel patterns CH1 and CH2.

Referring back to FIG. 12D, the gate electrode GE may be provided on a first top surface TS1 of the first channel pattern CH1 and on at least one first side surface SW1 of the first channel pattern CH1. The gate electrode GE may be provided on a second top surface TS2 of the second channel pattern CH2 and on at least one second side surface SW2 of the second channel pattern CH2. For example, the transistor according to the present embodiment may be a three-dimensional field-effect transistor (e.g., FinFET), in which the gate electrode GE is provided to three-dimensionally surround the channel pattern CH1 or CH2.

A pair of gate spacers GS may be disposed on opposite side surfaces of each of the gate electrodes GE. The gate spacers GS may extend along the gate electrodes GE and in the first direction D1. Top surfaces of the gate spacers GS may be higher than top surfaces of the gate electrodes GE. The top surfaces of the gate spacers GS may be coplanar with a top surface of a first interlayer insulating layer 110, which will be described below. The gate spacers GS may be formed of or include at least one of SiCN, SiCON, or SiN. In an embodiment, the gate spacers GS may be a multi-layered structure, which includes at least two different materials selected from SiCN, SiCON, and SiN.

A gate capping pattern GP may be provided on each of the gate electrodes GE. The gate capping pattern GP may extend along the gate electrode GE or in the first direction D1. The gate capping pattern GP may be formed of or include a material having an etch selectivity with respect to first and second interlayer insulating layers 110 and 120, which will be described below. For example, the gate capping patterns GP may be formed of or include at least one of SiON, SiCN, SiCON, or SiN.

Gate dielectric patterns GI may be respectively interposed between the gate electrode GE and the first active pattern AP1 and between and the gate electrode GE and the second active pattern AP2. The gate dielectric patterns GI may extend along bottom surfaces of the gate electrodes GE disposed thereon. As an example, a gate dielectric pattern GI may cover/contact the first top surface TS1 and the first side surface SW1 of the first channel pattern CH1. Another gate dielectric pattern GI may cover/contact the second top surface TS2 and the second side surfaces SW2 of the second channel pattern CH2. In an embodiment, the gate dielectric pattern GI may be provided to cover/contact a top surface of the device isolation layer ST below the gate electrode GE (e.g., see FIG. 12D).

In an embodiment, the gate dielectric pattern GI may be formed of or include a high-k dielectric material whose dielectric constant is higher than that of a silicon oxide layer. For example, the high-k dielectric material may include or be formed of at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate dielectric pattern GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr).

Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

M the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopant is aluminum (Al), a content of aluminum in the ferroelectric layer may range from 3 to 8 at % (atomic percentage). Here, the content of the dopants (e.g., aluminum atoms) may be a percentage of the number of aluminum atoms to the number of hafnium and aluminum atoms, e.g., in the ferroelectric layer.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The high-k metal oxides, which is used as the paraelectric layer, may include at least one of, for example, hafnium oxide, zirconium oxide, and/or aluminum oxide, but the inventive concept is not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from 0.5 to 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate dielectric pattern GI may include a single ferroelectric layer. As another example, the gate dielectric pattern GI may include a plurality of ferroelectric layers that are spaced apart from each other. The gate dielectric pattern GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate dielectric pattern GI and near the first and second channel patterns CH1 and CH2. The first metal pattern may include a work-function metal, which can be used to adjust a threshold voltage of the transistor. By adjusting a thickness and composition of the first metal pattern, it may be possible to realize a transistor having a desired threshold voltage.

The first metal pattern may include a metal nitride layer. For example, the first metal pattern may include a layer that is composed of at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of stacked work-function metal layers.

The second metal pattern may be formed of or include a metallic material whose resistance is lower than the first metal pattern. For example, the second metal pattern may include at least one metallic material, which is selected from the group consisting of tungsten (W), aluminum (Al), titanium (Ti), and tantalum (Ta).

The first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with the top surfaces of the gate capping patterns GP and the top surfaces of the gate spacers GS. A second interlayer insulating layer 120 may be provided on the first interlayer insulating layer 110 to cover/contact the gate capping patterns GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include or may be a silicon oxide layer.

A pair of division structures DB, which are opposite to each other in the second direction D2, may be provided at both sides of the first and second logic cells LC1 and LC2. The division structure DB may extend in the first direction D1 to be parallel to the gate electrodes GE. A pitch between the dividing structure DB and the gate electrode GE, which are adjacent to each other, may be equal to the first pitch P1.

The division structure DB may be provided to penetrate the first and second interlayer insulating layers 110 and 120 and may extend into the first and second active patterns AP1 and AP2. The division structure DB may be provided to penetrate an upper portion of each of the first and second active patterns AP1 and AP2. The division structure DB may separate the first and second active regions PR and NR of each of the first and second logic cells LC1 and LC2 from an active region of a neighboring logic cell.

Active contacts AC may be provided to penetrate the first and second interlayer insulating layers 110 and 120 and may be electrically connected to the first and second source/drain patterns SD1 and SD2, respectively. Each of the active contacts AC may be provided between a pair of the gate electrodes GE.

The active contacts AC may be a self-aligned contact. For example, the active contacts AC may be formed by a self-alignment process using the gate capping patterns GP and the gate spacers GS. In an embodiment, the active contacts AC may cover at least a portion of the side surfaces of the gate spacers GS. Although not shown, the active contacts AC may cover a portion of the top surfaces of the gate capping patterns GP.

Silicide patterns SC may be interposed between the active contacts AC and the first source/drain patterns SD1 and between the active contacts AC and the second source/drain patterns SD2. The active contacts AC may be electrically connected to the source/drain patterns SD1 and/or SD2 through the silicide patterns SC. The silicide patterns SC may be formed of or include at least one of metal silicide materials (e.g., titanium silicide, tantalum silicide, tungsten silicide, nickel silicide, and cobalt silicide).

A gate contact GC may be provided to penetrate the second interlayer insulating layer 120 and a gate capping pattern GP and may be electrically connected to a gate electrode GE.

Figure 12B:
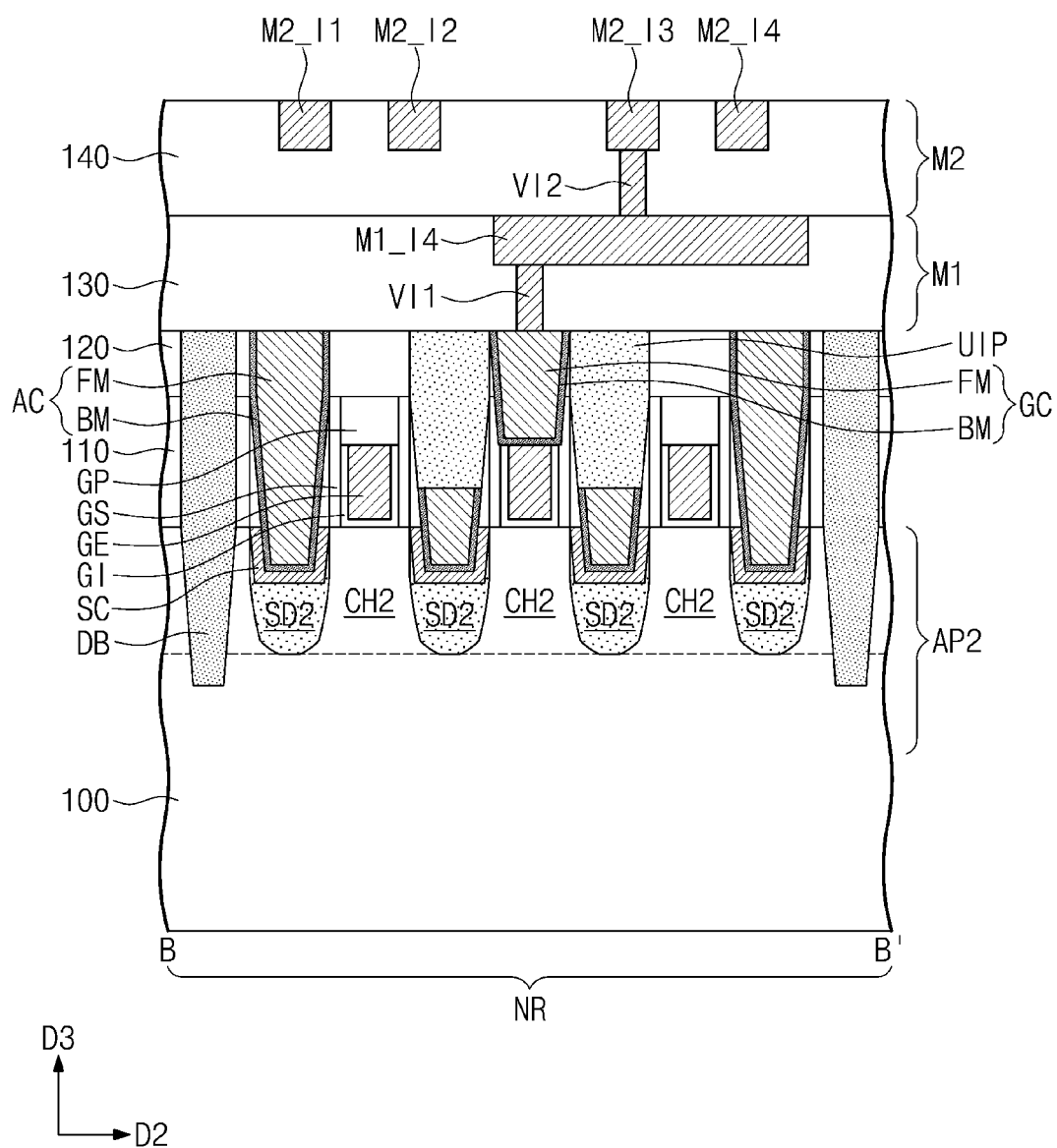
Figure 12C:
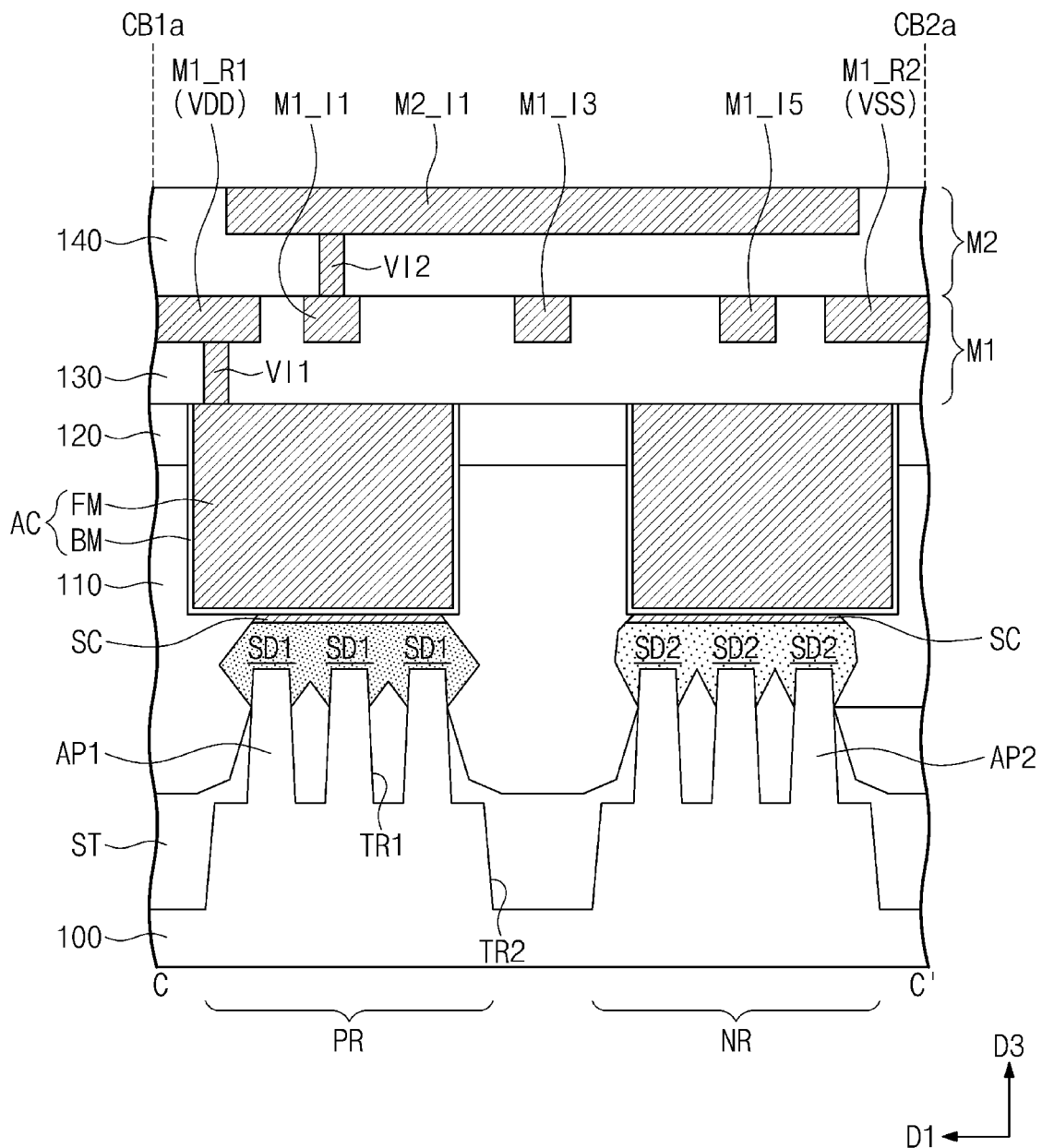
Figure 12D:
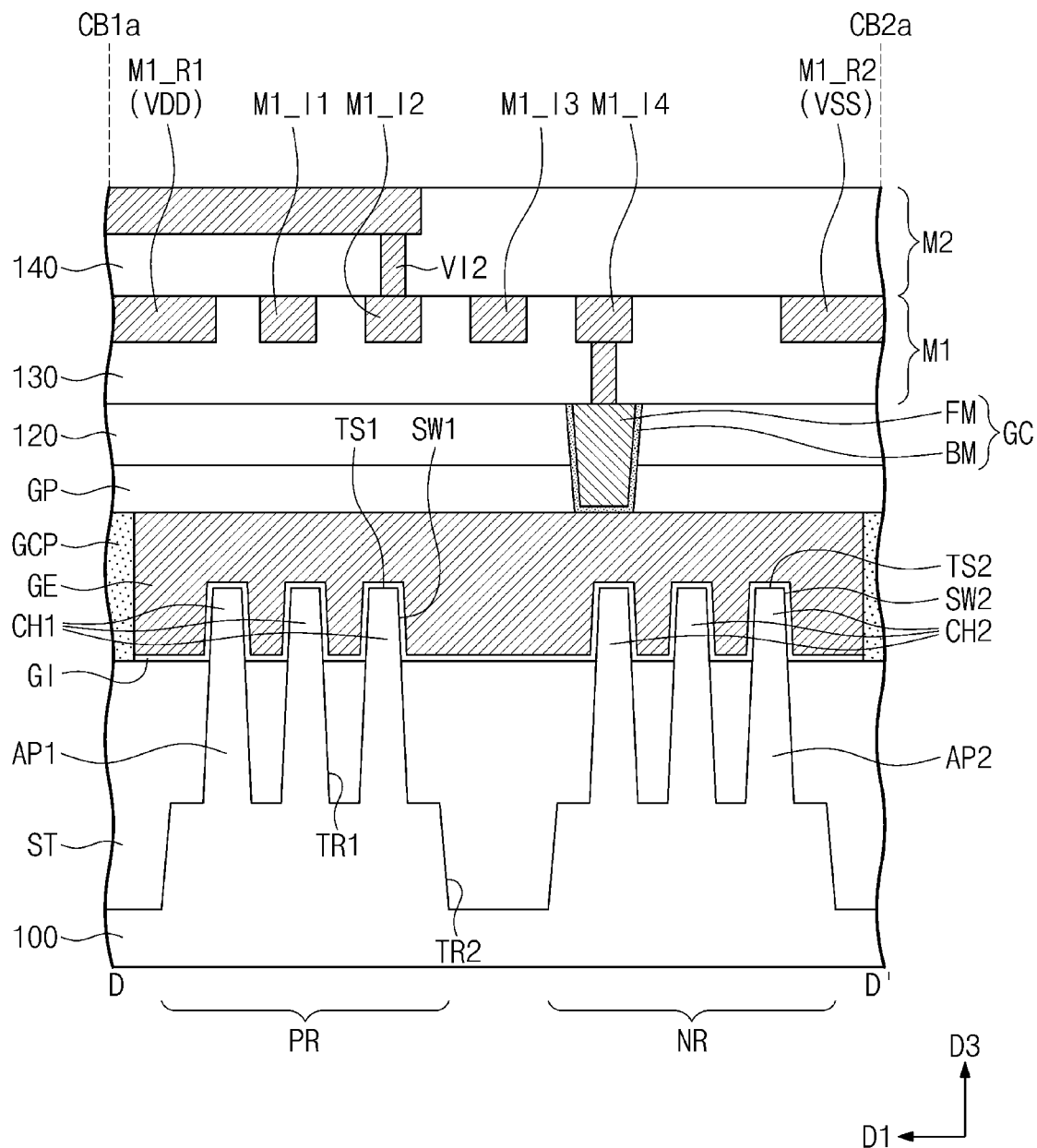
Figure 13:
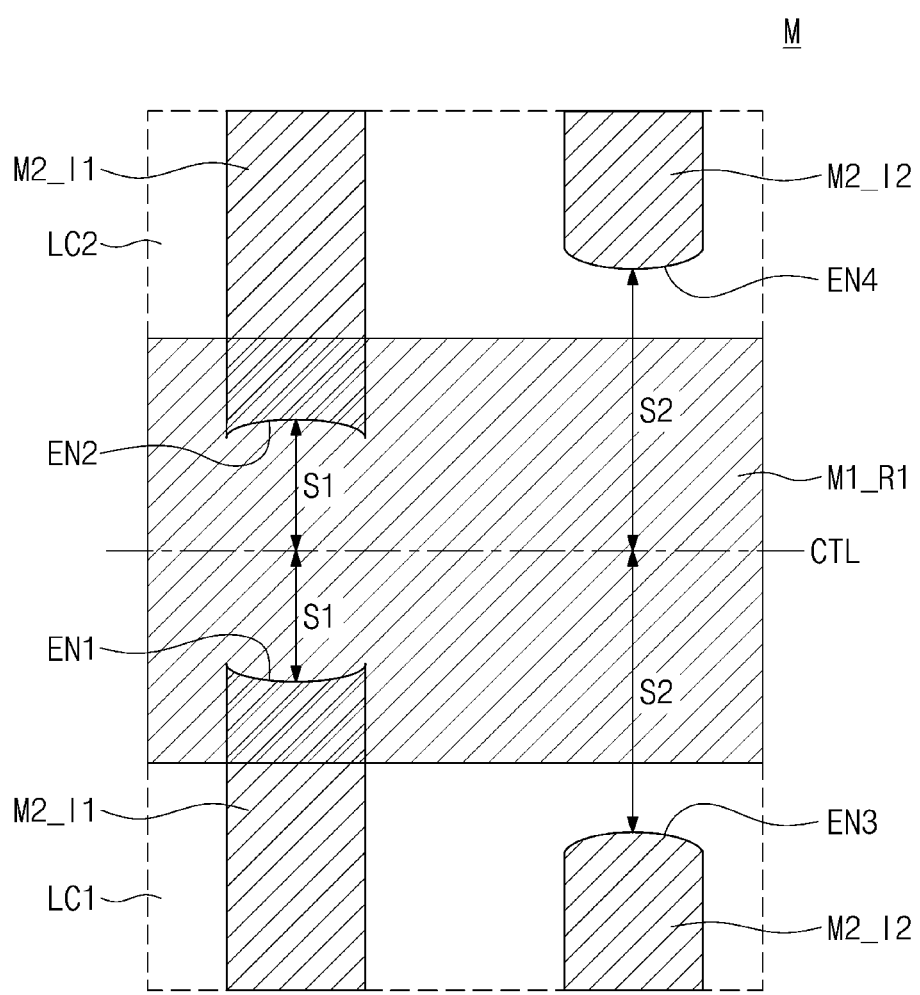
FIG. 13 is an enlarged plan view of a region M of FIG. 11.

Referring to FIG. 12B, an upper insulating pattern UIP may be provided to fill an upper region of each of the active contacts AC, which are adjacent to the gate contact GC. In this case, it may be possible to prevent the gate contact GC from being in contact with the active contact AC adjacent thereto and thereby prevent a short circuit issue from occurring between the gate and active contacts GC and AC.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum, copper, tungsten, molybdenum, and cobalt). The barrier pattern BM may be provided to cover/contact side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. The first metal layer M1 may include a first lower power line M1_R1, a second lower power line M1_R2, a third lower power line M1_R3, and first to tenth lower interconnection lines M1_I1 to M1_I10.

Each of the first to third lower power lines M1_R1 to M1_R3 may extend in the second direction D2 to cross the first logic cell LC1 or the second logic cell LC2. For example, the first and second cell borders CB1a and CB2a, which are opposite to each other in the first direction D1, may be defined in the first logic cell LC1. The first and second cell borders CB1a and CB2a may extend in the second direction D2. The first and second cell borders CB1b and CB2b, which are opposite to each other in the first direction D1, may be defined in the second logic cell LC2. The first and second cell borders CB1b and CB2b may extend in the second direction D2. The first cell border CB1a of the first logic cell LC1 may be substantially the same as the second cell border CB2b of the second logic cell LC2. For example, the first and second logic cells LC1 and LC2 may share a single cell border.

A gate cutting pattern GCP may be provided between the gate electrodes GE. The gate cutting pattern GCP may divide the gate electrode GE into a plurality of gate electrodes GE. The gate cutting pattern GCP may be provided on the first cell border CB1a of the first logic cell LC1, the second cell border CB2a of the first logic cell LC1, and the first cell border CB1b of the second logic cell LC2.

The first lower power line M1_R1 may be disposed on the first cell border CB1a of the first logic cell LC1. The second lower power line M1_R2 may be disposed on the second cell border CB2a of the first logic cell LC1. The third lower power line M1_R3 may be disposed on the first cell border CB1b of the second logic cell LC2. The center line CTL of the first lower power line M1_R1 parallel to the second direction D2 may overlap with the first cell border CB1a of the first logic cell LC1.

The first to fifth lower interconnection lines M1_I1 to M1_I5 may be disposed between the first and second lower power lines M1_R1 and M1_R2. Each of the first to fifth lower interconnection lines M1_I1 to M1_I5 may be a line- or bar-shaped structure extending in the second direction D2.

The sixth to tenth lower interconnection lines M1_I6 to M1_I10 may be disposed between the first and third lower power lines M1_R1 and M1_R3. Each of the sixth to tenth lower interconnection lines M1_I6 to M1_I10 may be a line- or bar-shaped structure extending in the second direction D2.

The first to fifth lower interconnection lines M1_I1 to M1_I5 may be arranged in the first direction D1 and may be spaced apart from each other with the second pitch P2 in the first direction D1. The sixth to tenth lower interconnection lines M1_I6 to M1_I10 may be arranged in the first direction D1 and may be spaced apart from each other with the second pitch P2 in the first direction D1. The second pitch P2 may be smaller than the first pitch P1. The first metal layer M1 may further include lower vias VI1. The lower vias VI1 may be provided below the lower interconnection lines. For example, the lower vias VI1 may electrically connect the lower interconnection lines to conductive patterns disposed below the first metal layer M1, e.g., the gate contact GC and the active contacts AC.

In an embodiment, the lower interconnection line and the lower via thereunder may be respectively formed through separate processes. For example, each of the lower interconnection line and the lower via of the first metal layer M1 may be formed by a single damascene process. The semiconductor device according to the present embodiment may be fabricated using a sub-20 nm process.

A second metal layer M2 may be provided in the fourth interlayer insulating layer 140. The second metal layer M2 may include first to fourth upper interconnection lines M2_I1 to M2_I4 and a routing line M2_O. Each of the upper interconnection lines of the second metal layer M2 may be a line- or bar-shaped structure extending in the first direction D1. For example, the upper interconnection lines may extend in the first direction D1 to be parallel to each other. When viewed in a plan view, the upper interconnection lines may be parallel to the gate electrodes GE. The upper interconnection lines may be arranged in the second direction D2 and may be spaced apart from each other with the third pitch P3 in the second direction D2. The third pitch P3 may be smaller than the first pitch P1. The third pitch P3 may be larger than the second pitch P2.

Each of the first to fourth upper interconnection lines M2_I1 to M2_I4 may extend from a region on the first active region PR to a region on the second active region NR. Each of the first to fourth upper interconnection lines M2_I1 to M2_I4 may not extend to a region beyond the first cell border CB1a or CB1b. Each of the first to fourth upper interconnection lines M2_I1 to M2_I4 may not extend to a region beyond the second cell border CB2a or CB2b. For example, the first to fourth upper interconnection lines M2_I1 to M2_I4 may not cross the first cell borders CB1a and CB1b and the second cell borders CB2a and CB2b.

An end portion of the first upper interconnection line M2_I1 may vertically overlap with at least one of the lower power lines M1_R1, M1_R2, and M1_R3. An end portion of the second upper interconnection line M2_I2 may not vertically overlap with the lower power lines M1_R1, M1_R2, and M1_R3. In an embodiment, the end portion of the second upper interconnection line M2_I2 may vertically overlap with at least one of the lower power lines M1_R1, M1_R2, and M1_R3.

The routing line M2_O may extend to a region beyond the first cell border CB1a or CB1b or the second cell border CB2a or CB2b. For example, the routing line M2_O may extend to a region on the second logic cell LC2, which is adjacent to the first logic cell LC1 in the first direction D1. For example, the routing line M2_O may connect a logic circuit of a logic cell to another logic circuit of another logic cell.

The second metal layer M2 may further include upper vias VI2. The upper vias VI2 may be provided below the upper interconnection lines. For example, the upper vias VI2 may electrically connect the upper interconnection lines to the lower interconnection lines.

The interconnection lines of the first metal layer M1 may be formed of or include a conductive material that is the same as or different from that of the second metal layer M2. For example, the interconnection lines of the first and second metal layers M1 and M2 may be formed of or include at least one of metallic materials (e.g., aluminum, copper, tungsten, molybdenum, and cobalt). Although not shown, a plurality of metal layers may be further stacked on the fourth interlayered insulating layer 140. Each of the stacked metal layers may include routing lines.

The second metal layer M2 will be described in more detail with reference to FIG. 13. Referring to FIG. 13, the first upper interconnection line M2_I1 on the first logic cell LC1 may include a first end EN1 provided as its end/tip portion. The first upper interconnection line M2_I1 on the second logic cell LC2 may include a second end EN2 provided as its end/tip portion. The first and second ends EN1 and EN2 may be spaced apart from each other with the center line CTL interposed therebetween and may face each other. Distances from the center line CTL to the respective first and second ends EN1 and EN2 may be substantially the same. For example, the largest/longest distance between the first end EN1 of the first upper interconnection line M2_I1 on the first logic cell LC1 and the center line CTL in the first direction D1 may be a first distance S1. For example, the first end EN1 may have a curved profile (e.g., a curved end line) in a plan view, and the distance between the first end EN1 and the center line CTL in the first direction D1 may depend on positions of the first end EN1. The largest/longest distance between the second end EN2 of the first upper interconnection line M2_I1 on the second logic cell LC2 and the center line CTL in the first direction D1 may be the first distance S1. For example, the second end EN2 may have a curved profile (e.g., a curved end line) in a plan view, and the distance between the second end EN2 and the center line CTL in the first direction D1 may depend on positions of the second end EN2. Each of the first and second ends EN1 and EN2 may have a concave profile, e.g., in a plan view. For example, an end portion of the upper interconnection line, which is adjacent to the cutting pattern CPa described with reference to FIG. 7, may have a concave profile. This concave profile may be formed by a process forming the first upper interconnection lines M2_I1 of the first and second logic cells LC1 and LC2 by interposing a cutting pattern CPa therebetween as explained in other parts of the disclosure. In an embodiment, the first and second ends EN1 and EN2 may have substantially the same curvature, e.g., having a mirror image symmetry with respect to the center line CTL in a plan view. Alternatively, the first and second ends EN1 and EN2 may have different curvatures from each other. Here, the curvature may be defined as a reciprocal of a radius of an imaginary circle that best approximates a curved end portion of an upper interconnection line.

The second upper interconnection line M2_I2 on the first logic cell LC1 may include a third end EN3 provided as its end/tip portion. The second upper interconnection line M2_I2 on the second logic cell LC2 may include a fourth end EN4 provided as its end/tip portion. The third and fourth ends EN3 and EN4 may be spaced apart from each other with the center line CTL interposed therebetween and may face each other. Distances from the center line CTL to the respective third and fourth ends EN3 and EN4 may be substantially the same. For example, the smallest/shortest distance between the third end EN3 of the second upper interconnection line M2_I2 on the first logic cell LC1 and the center line CTL in the first direction D1 may be a second distance S2. For example, the third end EN3 may have a curved profile (e.g., end line) in a plan view, and the distance between the third end EN3 and the center line CTL in the first direction D1 may depend on positions of the third end EN3. The smallest/shortest distance between the fourth end EN4 of the second upper interconnection line M2_I2 on the second logic cell LC2 and the center line CTL in the first direction D1 may be the second distance S2. For example, the fourth end EN4 may have a curved profile (e.g., end line) in a plan view, and the distance between the fourth end EN4 and the center line CTL in the first direction D1 may depend on positions of the fourth end EN4. Each of the third and fourth ends EN3 and EN4 may have a convex profile, e.g., in a plan view. For example, an end portion of the upper interconnection line, which is not adjacent to the cutting pattern CPa described with reference to FIG. 7, may have a convex profile. This convex profile may be formed by a process forming the second upper interconnection lines M2_I2 of the first and second logic cells LC1 and LC2 as explained in other parts of the disclosure. In an embodiment, the third and fourth ends EN3 and EN4 may be provided to have substantially the same curvature, e.g., having a mirror image symmetry with respect to the center line CTL in a plan view. Alternatively, the third and fourth ends EN3 and EN4 may be provided to have different curvatures from each other. The second upper interconnection line M2_I2 on the first logic cell LC1 may be described as a second upper interconnection line M2_I2 of the first logic cell LC1 and the second upper interconnection line M2_I2 on the second logic cell LC2 may be described as a second upper interconnection line M2_I2 of the second logic cell LC2. This nomenclature may also be applied to the third and fourth upper interconnection lines.

In an embodiment, the first and third ends EN1 and EN3 may be provided to have substantially the same curvature. Alternatively, the first and third ends EN1 and EN3 may be provided to have different curvatures from each other.

FIGS. 14, 16, 18, and 20 are enlarged plan views, each of which illustrates a region M of FIG. 11 and illustrates a method of fabricating a second metal layer of a semiconductor device according to an embodiment of the inventive concept. FIGS. 15, 17, 19, and 21 are sectional views which are taken along lines A-A' of FIGS. 14, 16, 18, and 20, respectively.

Figure 14:
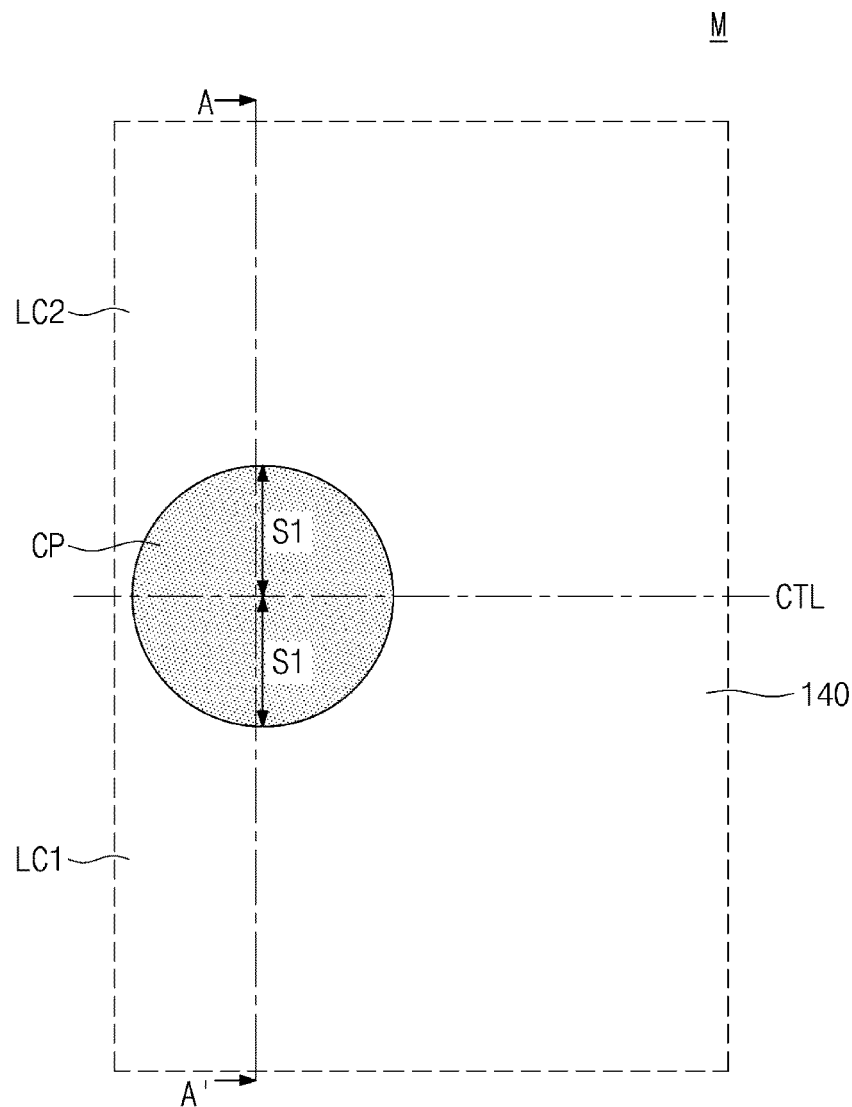
FIGS. 14, 16, 18, and 20 are enlarged plan views, each of which illustrates a region M of FIG. 11 and illustrates a method of fabricating a second metal layer of a semiconductor device according to an embodiment of the inventive concept.
Figure 15:
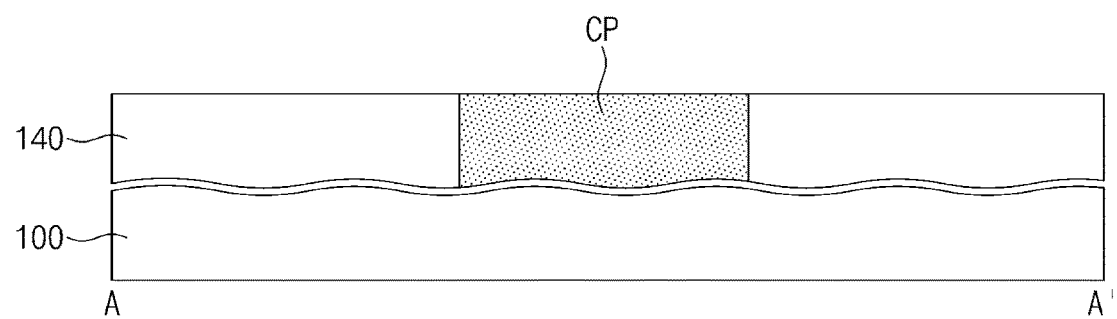
FIGS. 15, 17, 19, and 21 are sectional views which are taken along lines A-A' of FIGS. 14, 16, 18, and 20, respectively.

Referring to FIGS. 14 and 15, the fourth interlayer insulating layer 140 may be formed on the substrate 100. A cutting pattern CP may be formed in the fourth interlayer insulating layer 140. For example, the formation of the cutting pattern CP may include forming a first mask pattern (not shown) using a photomask, which is manufactured based on the design of the cutting pattern CPa of FIG. 6, etching an upper portion of the fourth interlayer insulating layer 140 using the first mask pattern as an etch mask to form an empty space, and filling the empty space with the cutting pattern CP. The cutting pattern CP may be formed of or include a material having an etch selectivity with respect to the fourth interlayer insulating layer 140. The largest width of the cutting pattern CP in the first direction D1 may be two times the first distance S1. The cutting pattern CP may be formed on the center line CTL of the first lower power line M1_R1. The cutting pattern CP may have a curved profile, e.g., in a plan view.

Figure 16:
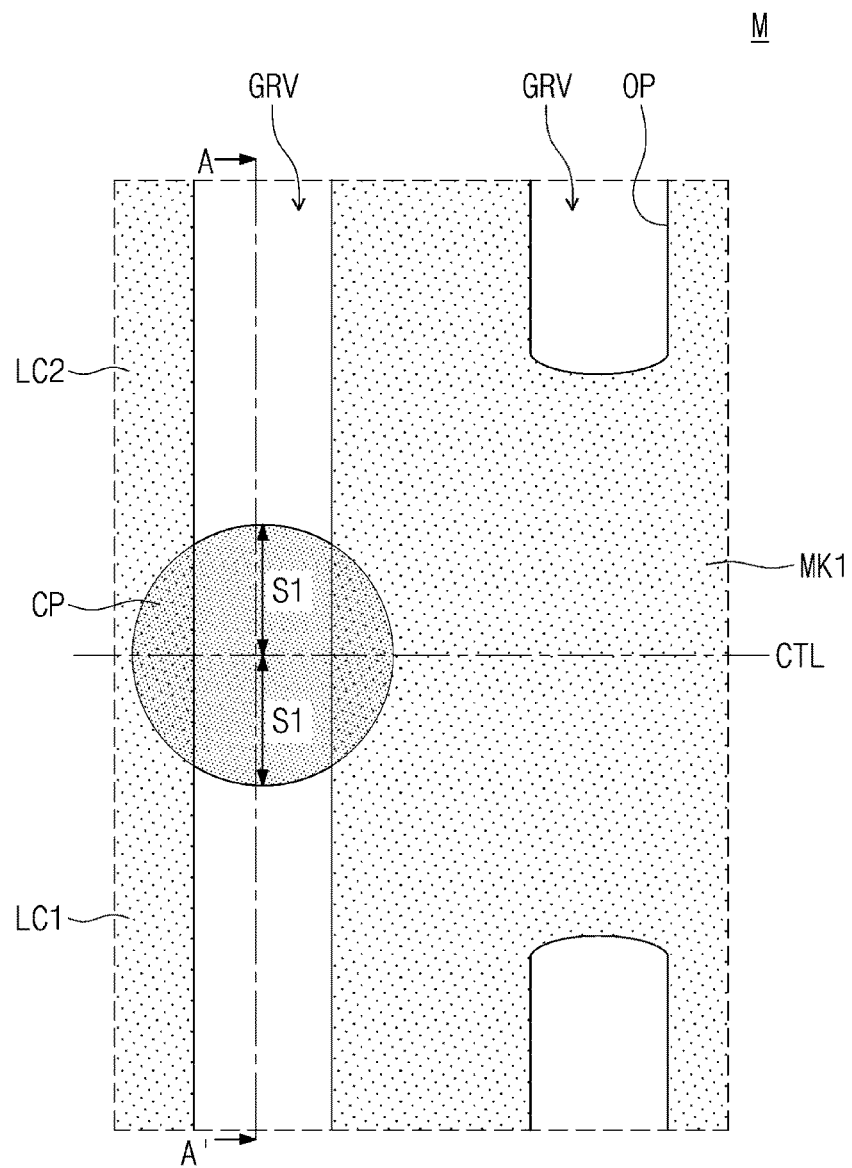
Figure 17:
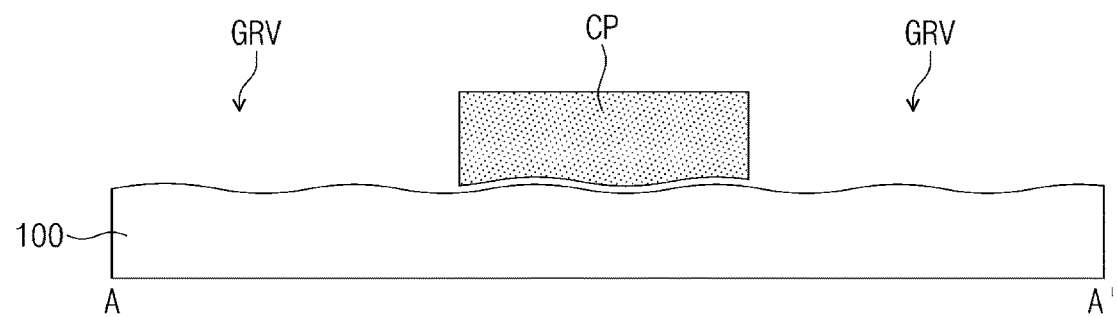

Referring to FIGS. 16 and 17, a first mask MK1 may be formed on the fourth interlayer insulating layer 140. An etching process using the first mask MK1 as an etch mask may be performed on the fourth interlayer insulating layer 140. Openings OP may be defined in the first mask MK1. The openings OP may define positions of the upper interconnection lines to be formed in a subsequent step. The cutting pattern CP may not be etched by the etching process, and grooves GRV may be formed in the fourth interlayer insulating layer 140. The grooves GRV may be formed in an upper portion of the fourth interlayer insulating layer 140.

Figure 18:
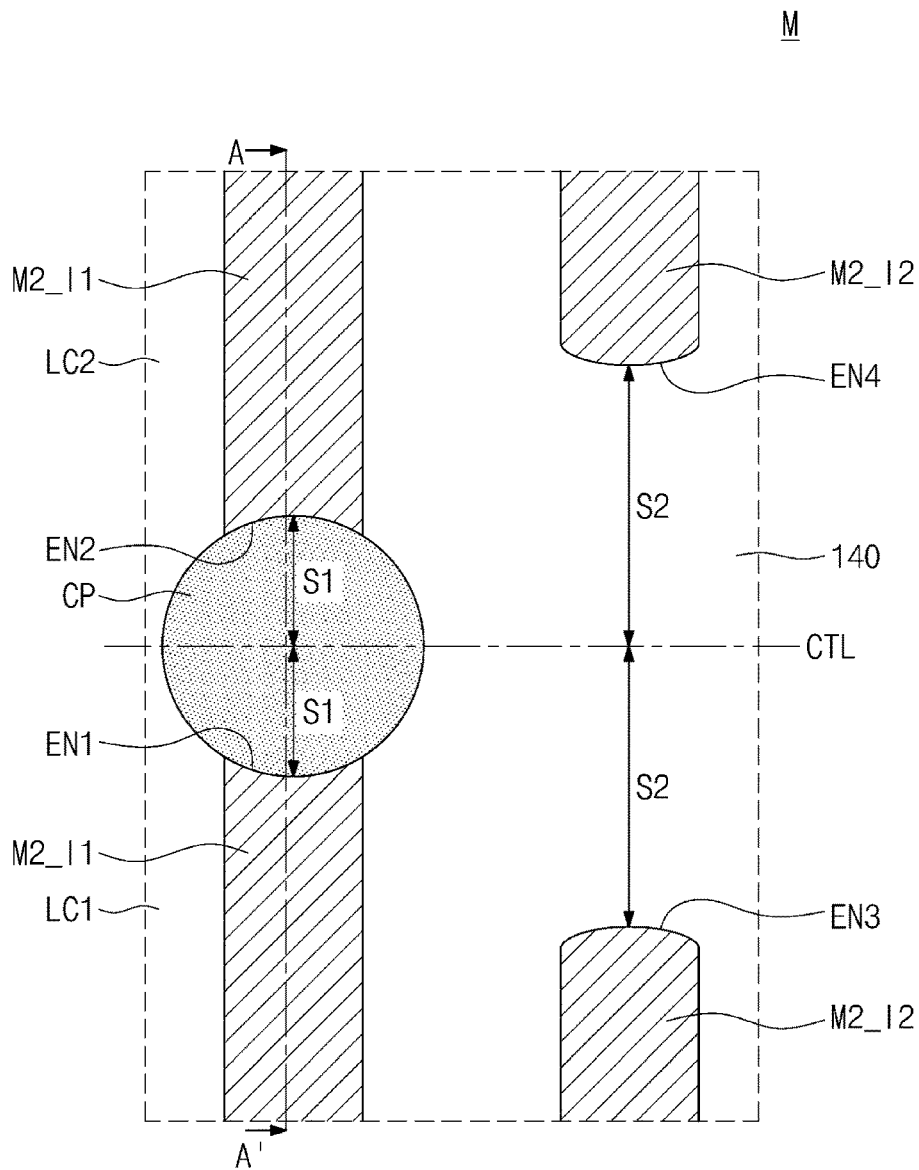
Figure 19:
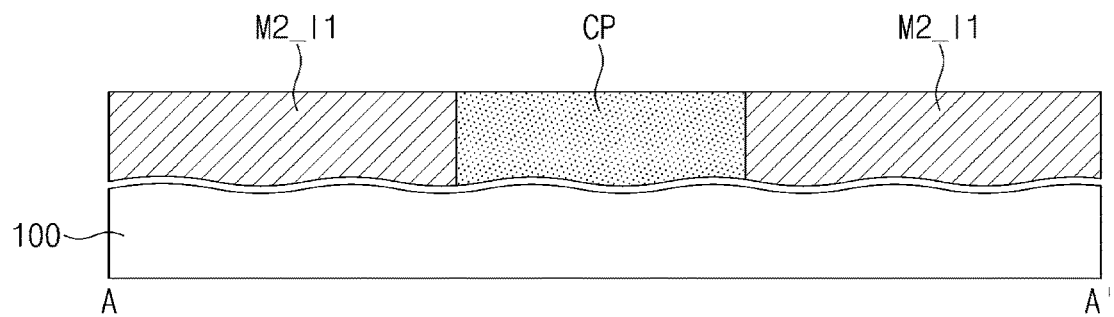

Referring to FIGS. 18 and 19, a conductive material may be formed to fill the grooves GRV. As a result, the first upper interconnection lines M2_I1 and the second upper interconnection lines M2_I2 may be formed in the fourth interlayer insulating layer 140. The first upper interconnection line M2_I1 on the first logic cell LC1 may be spaced apart from the first upper interconnection line M2_I1 on the second logic cell LC2 by the cutting pattern CP. The first and second ends EN1 and EN2 may have a profile corresponding to a profile of the cutting pattern CP. For example, each of the first and second ends EN1 and EN2 may have a concave profile.

Figure 20:
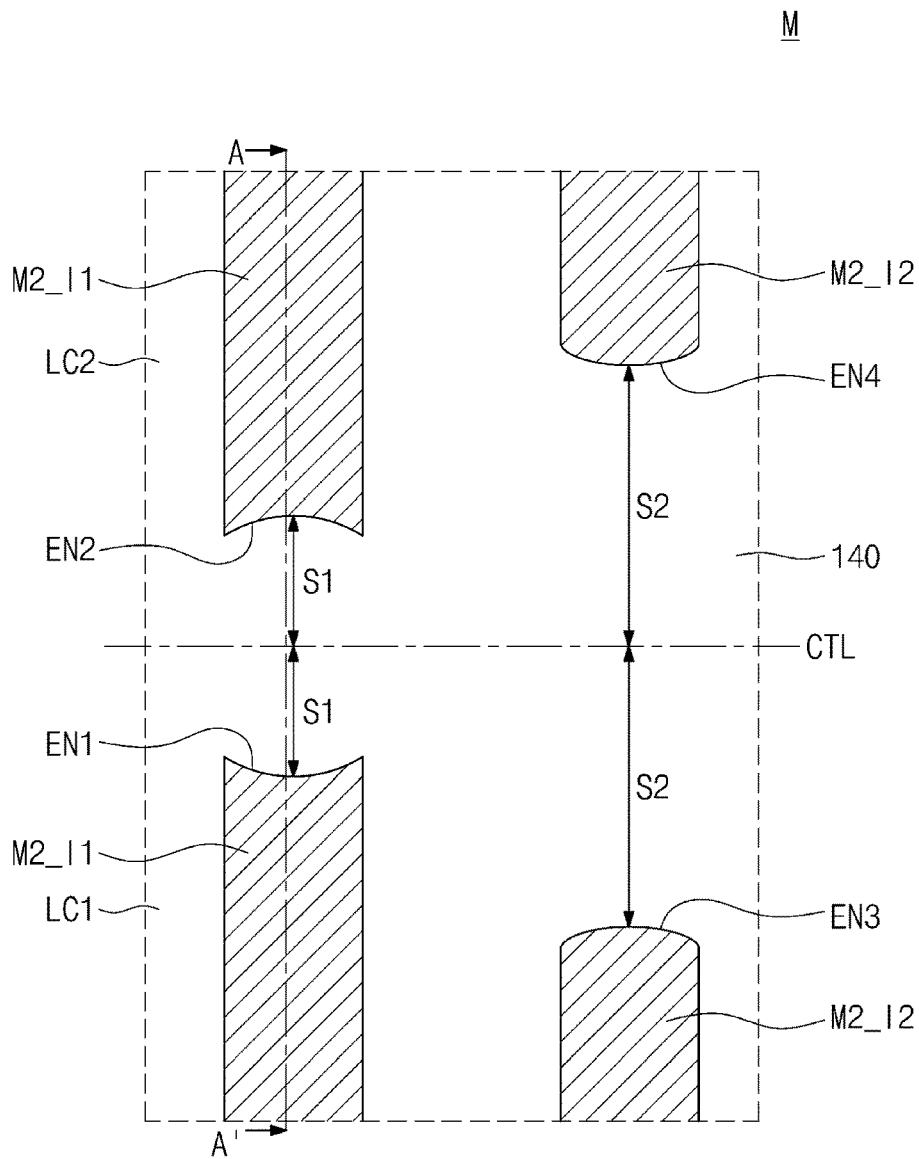
Figure 21:
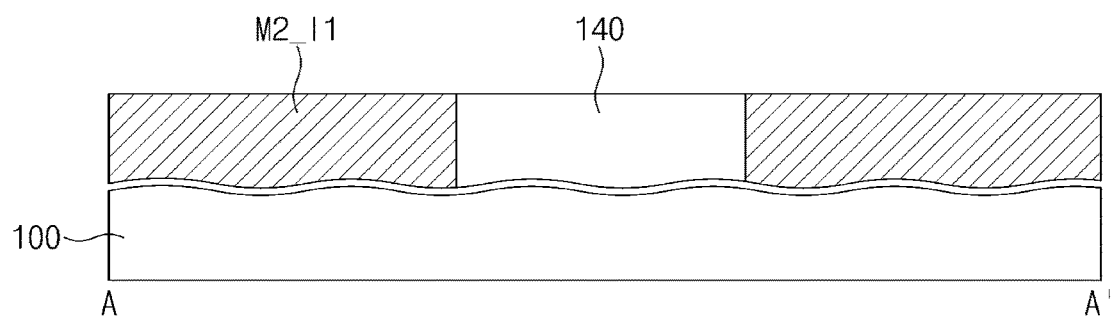

Referring to FIGS. 20 and 21, the cutting pattern CP may be selectively removed. An empty space, which is formed by removing the cutting pattern CP, may be filled with an insulating material. In the final step of the fabrication process, the first upper interconnection line M2_I1 and the second upper interconnection line M2_I2 may have the structure shown in FIG. 13.

Figure 22:
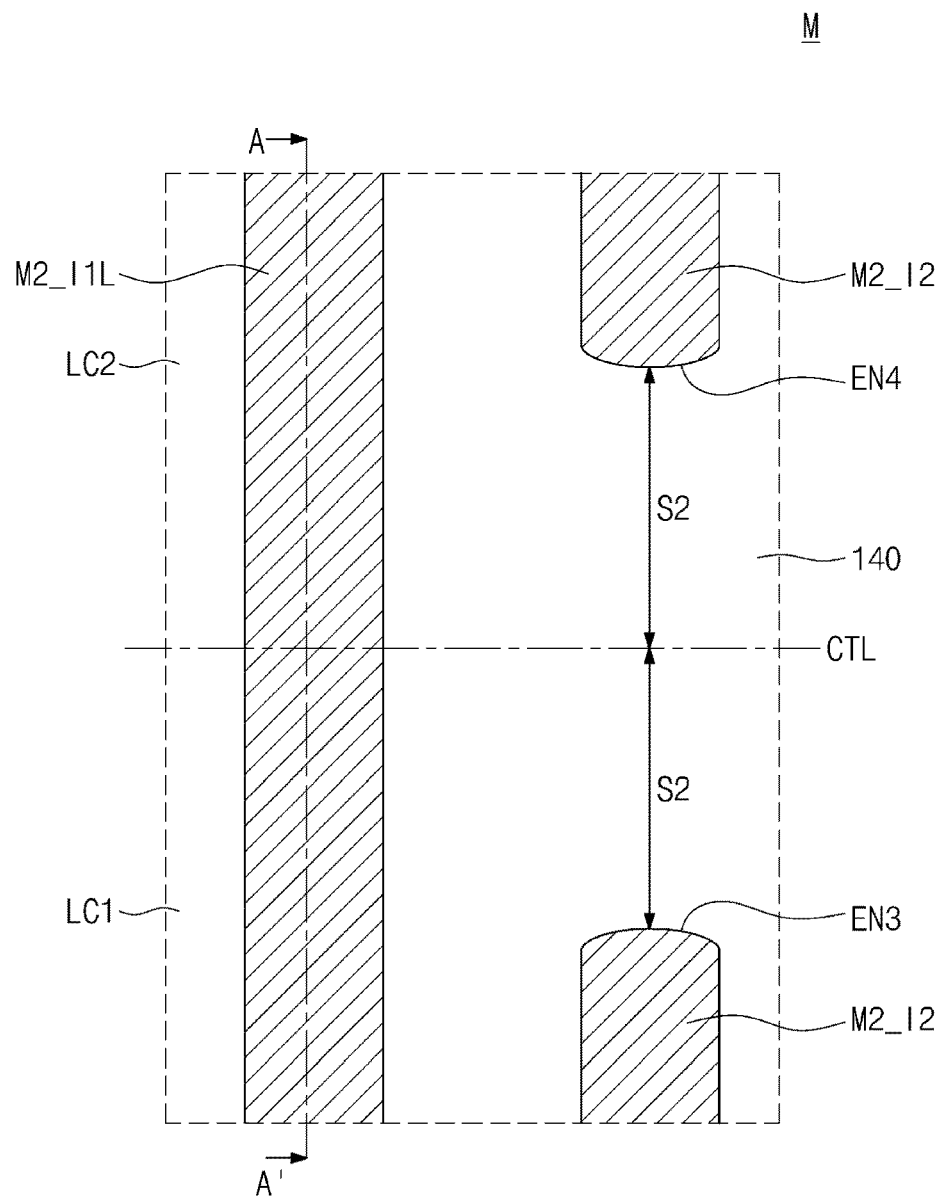
FIGS. 22 and 24 are enlarged plan views, each of which illustrates a region M of FIG. 11 and illustrates a method of fabricating a second metal layer of a semiconductor device according to an embodiment of the inventive concept.
Figure 23:
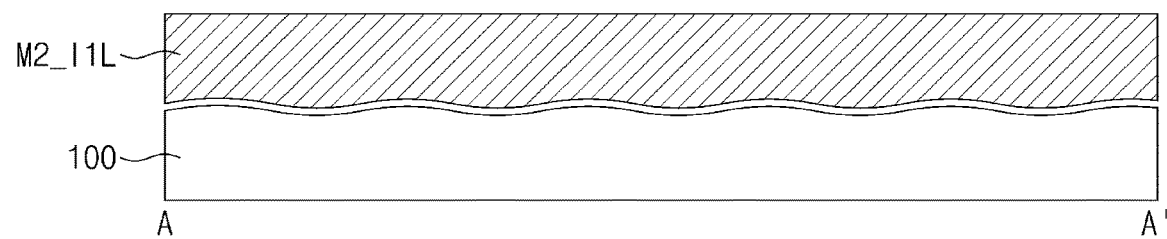
FIGS. 23 and 25 are sectional views which are respectively taken along lines A-A' of FIGS. 22 and 24.
Figure 24:
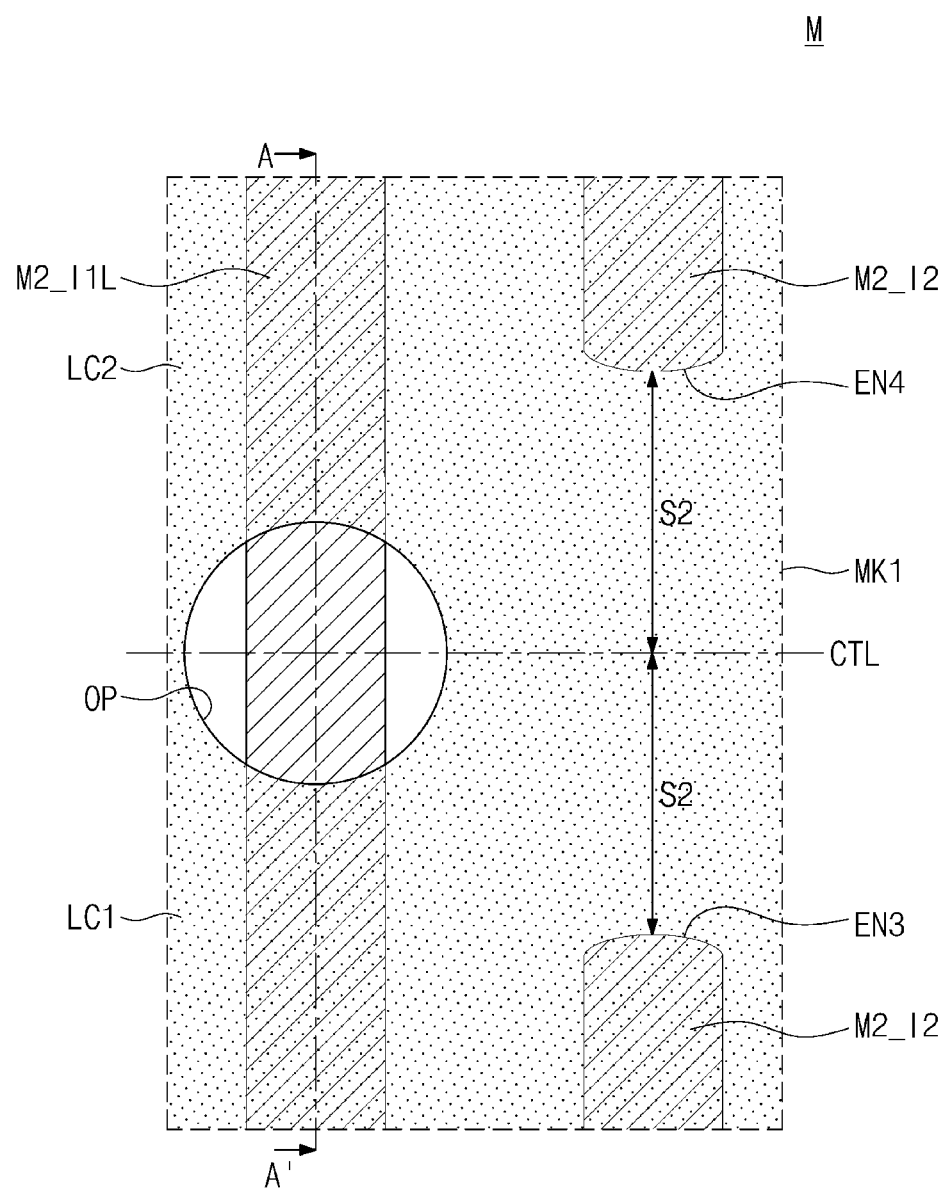
Figure 25:
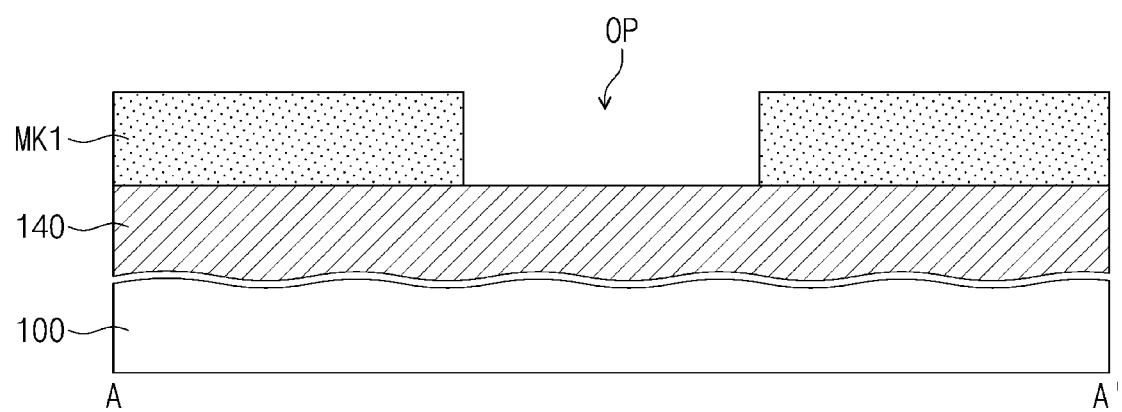

FIGS. 22 and 24 are enlarged plan views, each of which illustrates a region M of FIG. 11 and illustrates a method of fabricating a second metal layer of a semiconductor device according to an embodiment of the inventive concept. FIGS. 23 and 25 are sectional views which are respectively taken along lines A-A' of FIGS. 22 and 24.

Referring to FIGS. 22 and 23, a first preliminary upper interconnection line M2_I1L and second upper interconnection lines M2_I2 may be formed in an upper portion of the fourth interlayer insulating layer 140. The first preliminary upper interconnection line M2_I1L may extend in the first direction D1 to cross the center line CTL. An end portion of each of the second upper interconnection lines M2_I2 may have a convex profile.

Referring to FIGS. 24 and 25, the first mask MK1 may be formed on the fourth interlayer insulating layer 140. The opening OP may be defined in the first mask MK1. The opening OP may be formed using a photomask, which is manufactured based on a design of the cutting pattern CPa shown in FIG. 6. The opening OP may have a convex profile. The largest width of the opening OP in the first direction D1 may be two times the first distance S1.

Referring back to FIGS. 20 and 21, the first preliminary upper interconnection line M2_I1L may be etched by an etching process using the first mask MK1 as an etch mask. The first upper interconnection lines M2_I1 may be formed by the etching of the first preliminary upper interconnection line M2_I1L. The first upper interconnection line M2_I1 on the first logic cell LC1 may be spaced apart from the first upper interconnection line M2_I1 on the second logic cell LC2 in the first direction D1. Each of the first and second ends EN1 and EN2 may have a concave profile. An empty space, which is formed by etching the first preliminary upper interconnection line M2_I1L, may be filled with an insulating material. For example, an insulating pattern formed of the insulating material may be interposed between the first upper interconnection line M2_I1 on the first logic cell LC1 and the first upper interconnection line M2_I1 on the second logic cell LC2. In the final step of the fabrication process, the first upper interconnection line M2_I1 and the second upper interconnection line M2_I2 may have the structure shown in FIG. 13.

Figure 26:
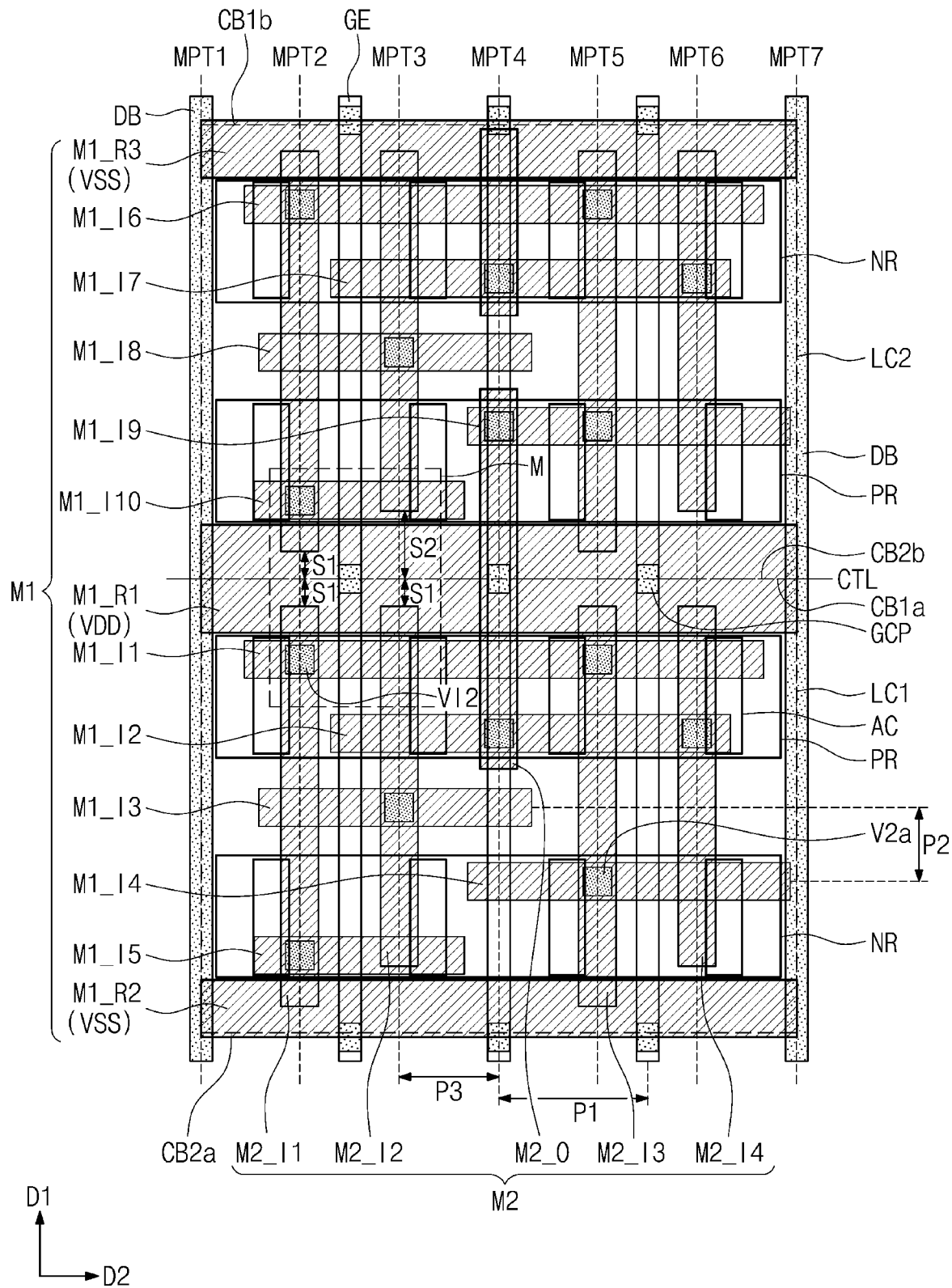
FIG. 26 is a plan view illustrating a semiconductor device according to an embodiment of the inventive concept.
Figure 27:
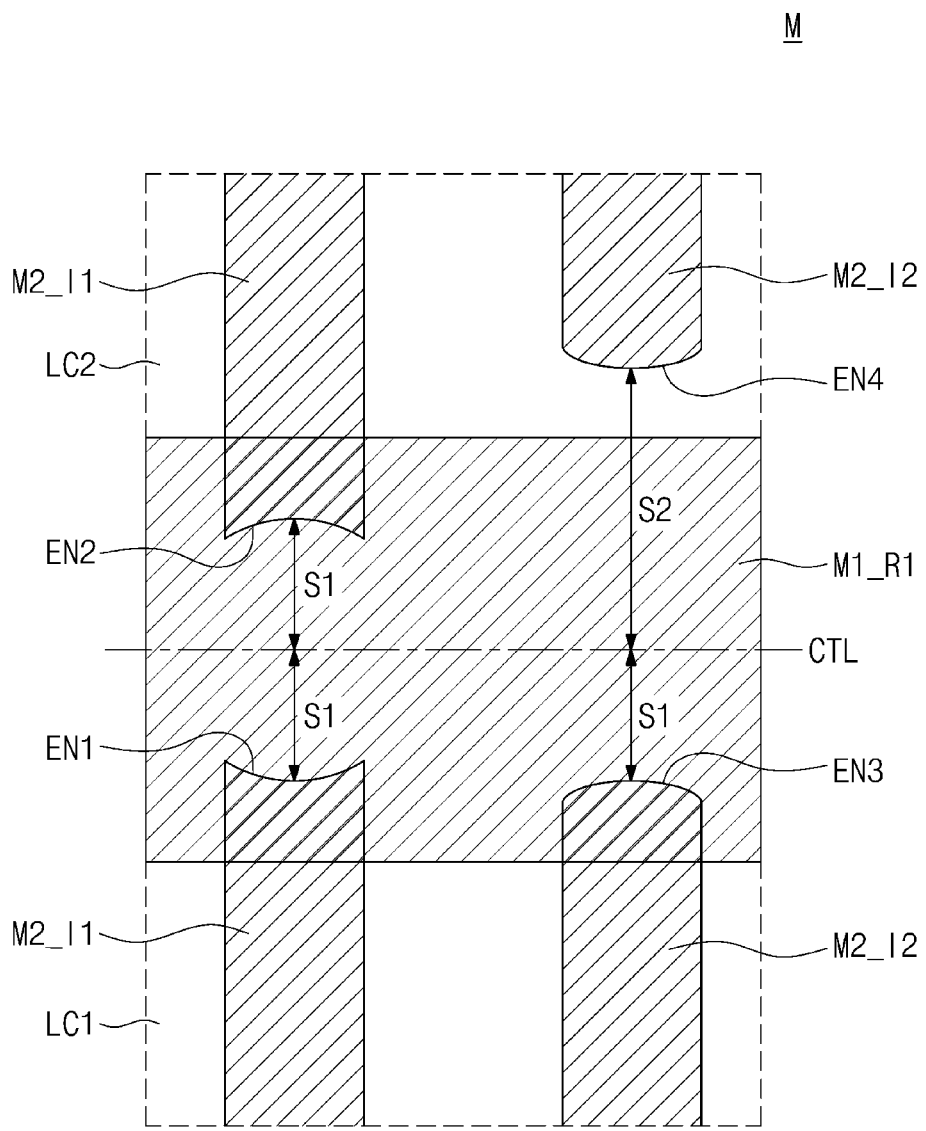
FIG. 27 is an enlarged plan view of a region M of FIG. 26.

FIG. 26 is a plan view illustrating a semiconductor device according to an embodiment of the inventive concept. FIG. 27 is an enlarged plan view of a region M of FIG. 26. The semiconductor device of FIGS. 26 and 27 is an example of a semiconductor device that is actually realized on a substrate using the layout of FIG. 8. In the following description of the present embodiment, elements previously described with reference to FIG. 13 may not be described again for the sake of brevity.

Referring to FIGS. 26 and 27, the largest/longest distance between the first upper interconnection line M2_I1 on the first logic cell LC1 and the center line CTL may be a first distance S1. The largest/longest distance between the first upper interconnection line M2_I1 on the second logic cell LC2 and the center line CTL may be the first distance S1. Each of the first and second ends EN1 and EN2 may have a concave profile. For example, an end portion of the upper interconnection line, which is adjacent to the cutting pattern CPa described with reference to FIG. 8, may have a concave profile.

The smallest/shortest distance between the second upper interconnection line M2_I2 on the first logic cell LC1 and the center line CTL may be the first distance S1. The smallest/shortest distance between the second upper interconnection line M2_I2 on the second logic cell LC2 and the center line CTL may be a second distance S2. Each of the third and fourth ends EN3 and EN4 may have a convex profile. For example, an end portion of the upper interconnection line, which is not adjacent to the cutting pattern CPa described with reference to FIG. 8, may have a convex profile.

Figure 28:
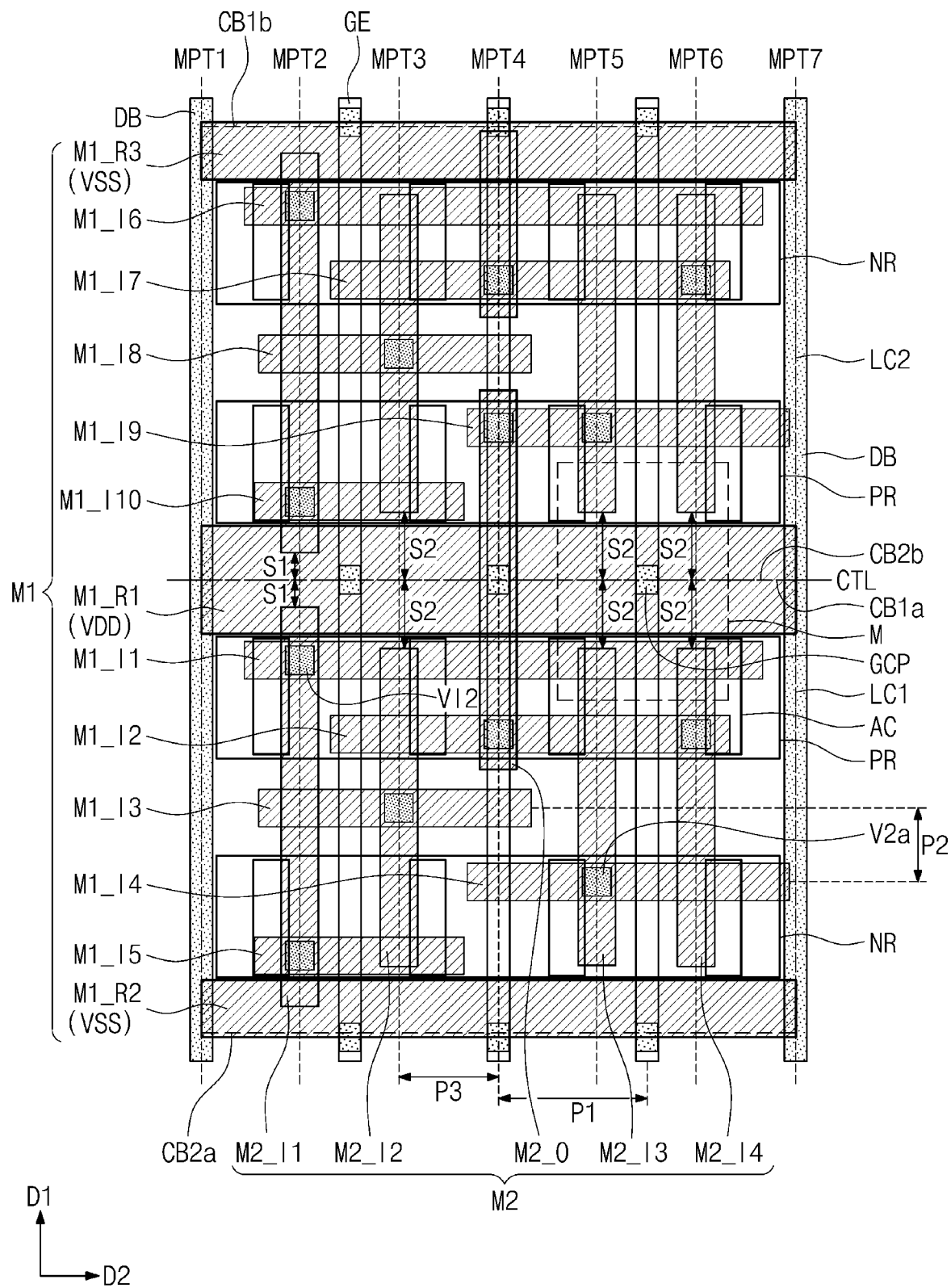
FIG. 28 is a plan view illustrating a semiconductor device according to an embodiment of the inventive concept.
Figure 29:
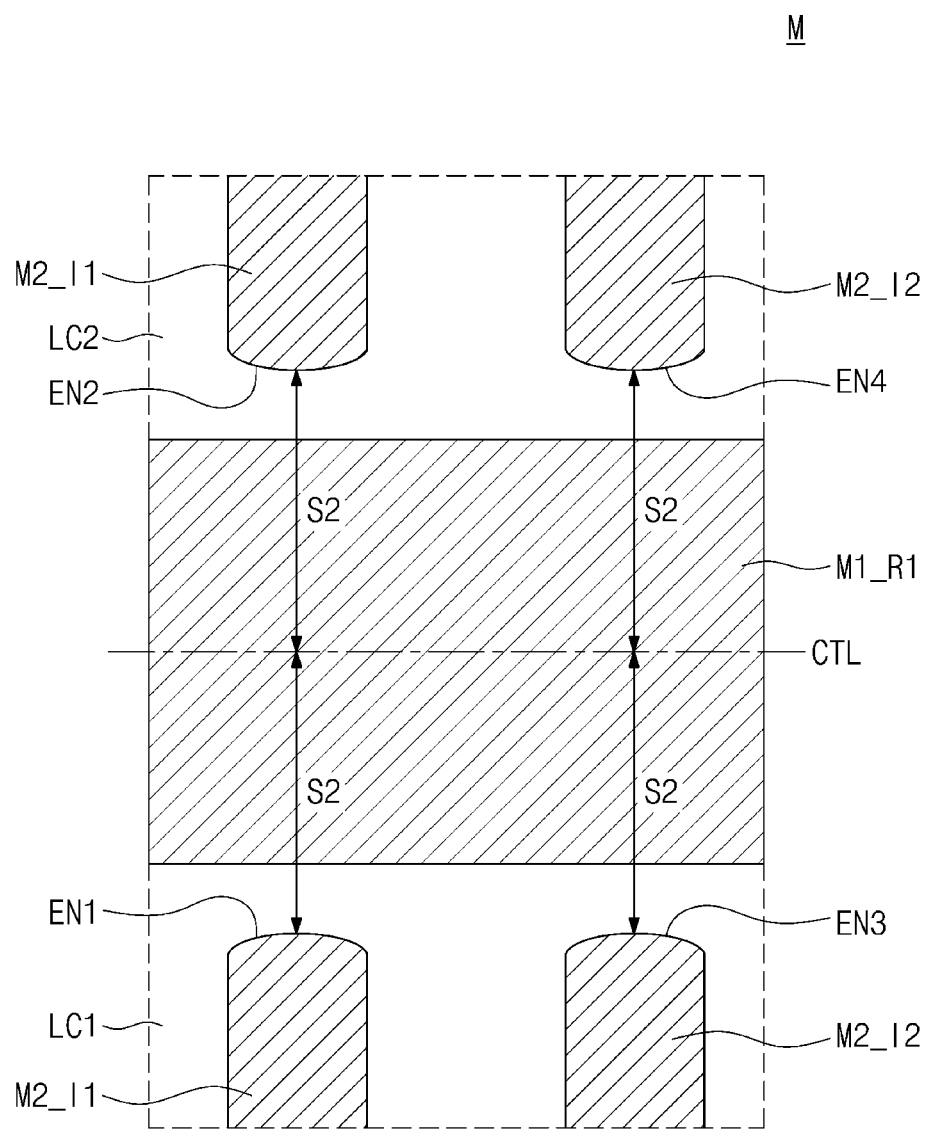
FIG. 29 is an enlarged plan view of a region M of FIG. 28.

FIG. 28 is a plan view illustrating a semiconductor device according to an embodiment of the inventive concept. FIG. 29 is an enlarged plan view of a region M of FIG. 28. The semiconductor device of FIGS. 28 and 29 is an example of a semiconductor device that is actually realized on a substrate using the layout of FIG. 9. In the following description of the present embodiment, elements previously described with reference to FIG. 13 may not be described again for the sake of brevity.

Referring to FIGS. 28 and 29, the third upper interconnection line M2_I3 on the first logic cell LC1 may include a first end EN1 provided as its end/tip portion. The third upper interconnection line M2_I3 on the second logic cell LC2 may include a second end EN2 provided as its end/tip portion. The first and second ends EN1 and EN2 may be spaced apart from each other with the center line CTL interposed therebetween and may face each other. The smallest/shortest distance between the third upper interconnection line M2_I3 on the first logic cell LC1 and the center line CTL may be a second distance S2. The smallest/shortest distance between the third upper interconnection line M2_I3 on the second logic cell LC2 and the center line CTL may be the second distance S2. For example, distances from the center line CTL to the respective first and second ends EN1 and EN2 may be substantially the same. Each of the first and second ends EN1 and EN2 may have a convex profile. For example, an end portion of the upper interconnection line, which is not adjacent to (e.g., not contact) the cutting pattern CPa described with reference to FIG. 9, may have a convex profile. In an embodiment, the first and second ends EN1 and EN2 may be provided to have substantially the same curvature, e.g., having a mirror image symmetry with respect to the center line CTL in a plan view. Alternatively, the first and second ends EN1 and EN2 may be provided to have different curvatures from each other.

The fourth upper interconnection line M2_I4 on the first logic cell LC1 may include a third end EN3 provided as its end/tip portion. The fourth upper interconnection line M2_I4 on the second logic cell LC2 may include a fourth end EN4 provided as its end/tip portion. The third and fourth ends EN3 and EN4 may be spaced apart from each other with the center line CTL interposed therebetween and may face each other. The smallest/shortest distance between the fourth upper interconnection line M2_I4 on the first logic cell LC1 and the center line CTL may be the second distance S2. The smallest/shortest distance between the fourth upper interconnection line M2_I4 on the second logic cell LC2 and the center line CTL may be the second distance S2. For example, distances from the center line CTL to the respective third and fourth ends EN3 and EN4 may be substantially the same. Each of the third and fourth ends EN3 and EN4 may have a convex profile. For example, an end portion of the upper interconnection line, which is not adjacent to (e.g., not contact) the cutting pattern CPa described with reference to FIG. 9, may have a convex profile. In an embodiment, the third and fourth ends EN3 and EN4 may be provided to have substantially the same curvature, e.g., having a mirror image symmetry with respect to the center line CTL in a plan view. Alternatively, the third and fourth ends EN3 and EN4 may be provided to have different curvatures from each other. In an embodiment, the first and third ends EN1 and EN3 may be provided to have substantially the same curvature. Alternatively, the first and third ends EN1 and EN3 may be provided to have different curvatures from each other.

Figure 30:
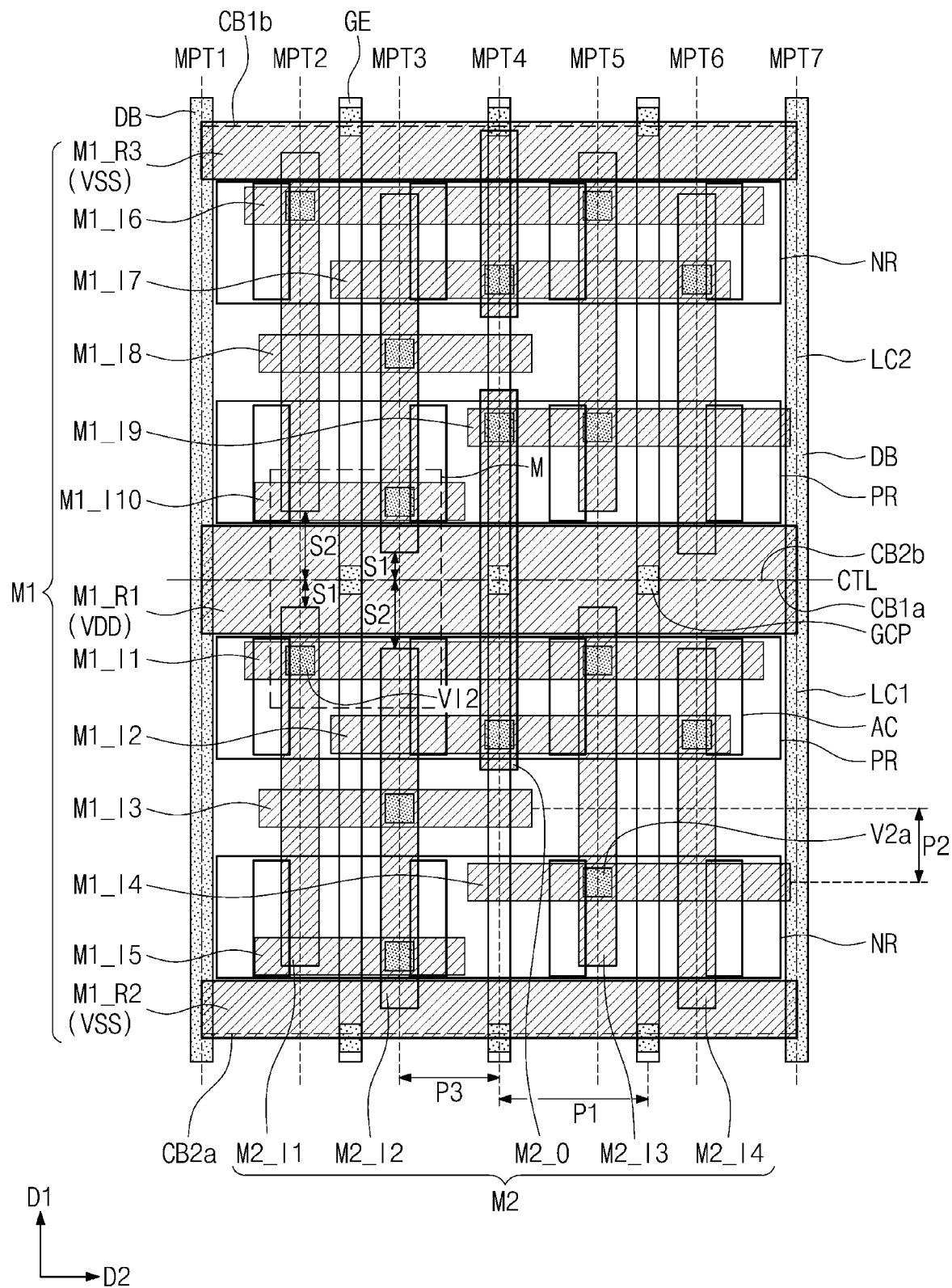
FIG. 30 is a plan view illustrating a semiconductor device according to an embodiment of the inventive concept.
Figure 31:
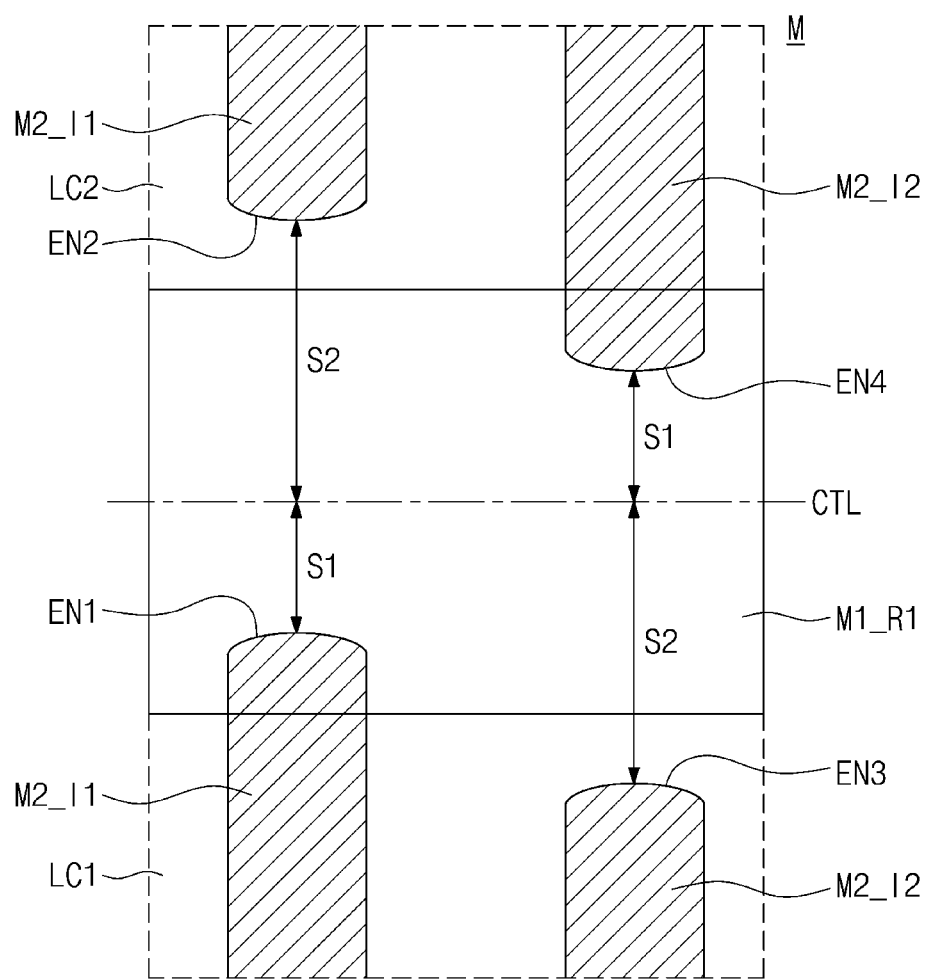
FIG. 31 is an enlarged plan view of a region M of FIG. 30.

FIG. 30 is a plan view illustrating a semiconductor device according to an embodiment of the inventive concept. FIG. 31 is an enlarged plan view of a region M of FIG. 30. The semiconductor device of FIGS. 30 and 31 is an example of a semiconductor device that is actually realized on a substrate using the layout of FIG. 10. In the following description of the present embodiment, elements previously described with reference to FIG. 13 may not be described again for the sake of brevity.

Referring to FIGS. 30 and 31, the smallest/shortest distance between the first upper interconnection line M2_I1 on the first logic cell LC1 and the center line CTL may be a first distance S1. The smallest/shortest distance between the first upper interconnection line M2_I1 on the second logic cell LC2 and the center line CTL may be a second distance S2. Each of the first and second ends EN1 and EN2 may have a convex profile. For example, an end portion of the upper interconnection line, which is not adjacent to the cutting pattern CPa described with reference to FIG. 10, may have a convex profile.

The smallest/shortest distance between the second upper interconnection line M2_I2 on the first logic cell LC1 and the center line CTL may be the second distance S2. The smallest/shortest distance between the second upper interconnection line M2_I2 on the second logic cell LC2 and the center line CTL may be the first distance S1. Each of the third and fourth ends EN3 and EN4 may have a convex profile. For example, an end portion of the upper interconnection line, which is not adjacent to the cutting pattern CPa described with reference to FIG. 10, may have a convex profile.

FIGS. 32A to 32D are sectional views which are respectively taken along the lines A-A', B-B', C-C', and D-D' of FIG. 11. For concise description, elements previously described with reference to FIGS. 11 and 12A to 12D may be identified by the same reference numbers without repeating an overlapping description thereof.

Referring to FIG. 11 and FIGS. 32A to 32D, the substrate 100 including the first and second active regions PR and NR may be provided. The device isolation layer ST may be provided on the substrate 100. The device isolation layer ST may define the first and second active patterns AP1 and AP2 in an upper portion of the substrate 100. The first and second active patterns AP1 and AP2 may be defined on the first and second active regions PR and NR, respectively.

The first active pattern AP1 may include first channel patterns CH1, which are vertically stacked. The stacked first channel patterns CH1 may be spaced apart from each other in a third direction D3. The stacked first channel patterns CH1 may vertically overlap with each other. The second active pattern AP2 may include second channel patterns CH2, which are vertically stacked. The stacked second channel patterns CH2 may be spaced apart from each other in the third direction D3. The stacked second channel patterns CH2 may vertically overlap with each other. The first and second channel patterns CH1 and CH2 may be formed of or include at least one of silicon (Si), germanium (Ge), or silicon-germanium (SiGe).

The first active pattern AP1 may further include first source/drain patterns SD1. The stacked first channel patterns CH1 may be interposed between each adjacent pair of the first source/drain patterns SD1. The stacked first channel patterns CH1 may electrically connect the adjacent pair of the first source/drain patterns SD1 to each other.

The second active pattern AP2 may further include second source/drain patterns SD2. The stacked second channel patterns CH2 may be interposed between each adjacent pair of the second source/drain patterns SD2. The stacked second channel patterns CH2 may electrically connect the adjacent pair of the second source/drain patterns SD2 to each other.

The gate electrodes GE may be provided to cross the first and second channel patterns CH1 and CH2 and to extend in the first direction D1. The gate electrode GE may vertically overlap with the first and second channel patterns CH1 and CH2. A pair of the gate spacers GS may be disposed on opposite side surfaces of the gate electrode GE. The gate capping pattern GP may be provided on the gate electrode GE.

Figure 32A:
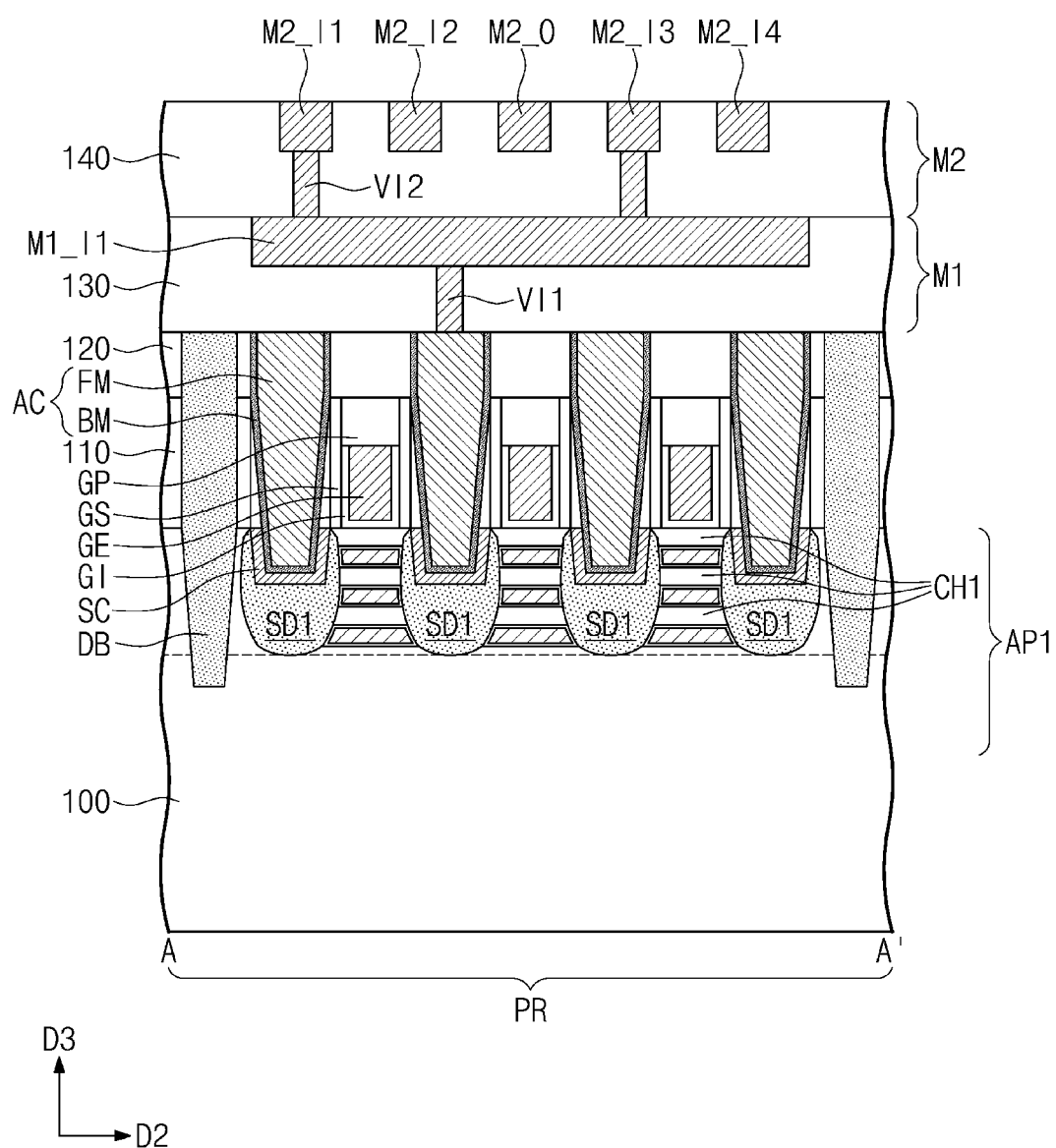
FIGS. 32A to 32D are sectional views which are respectively taken along the lines A-A', B-B', C-C', and D-D' of FIG. 11.
Figure 32B:
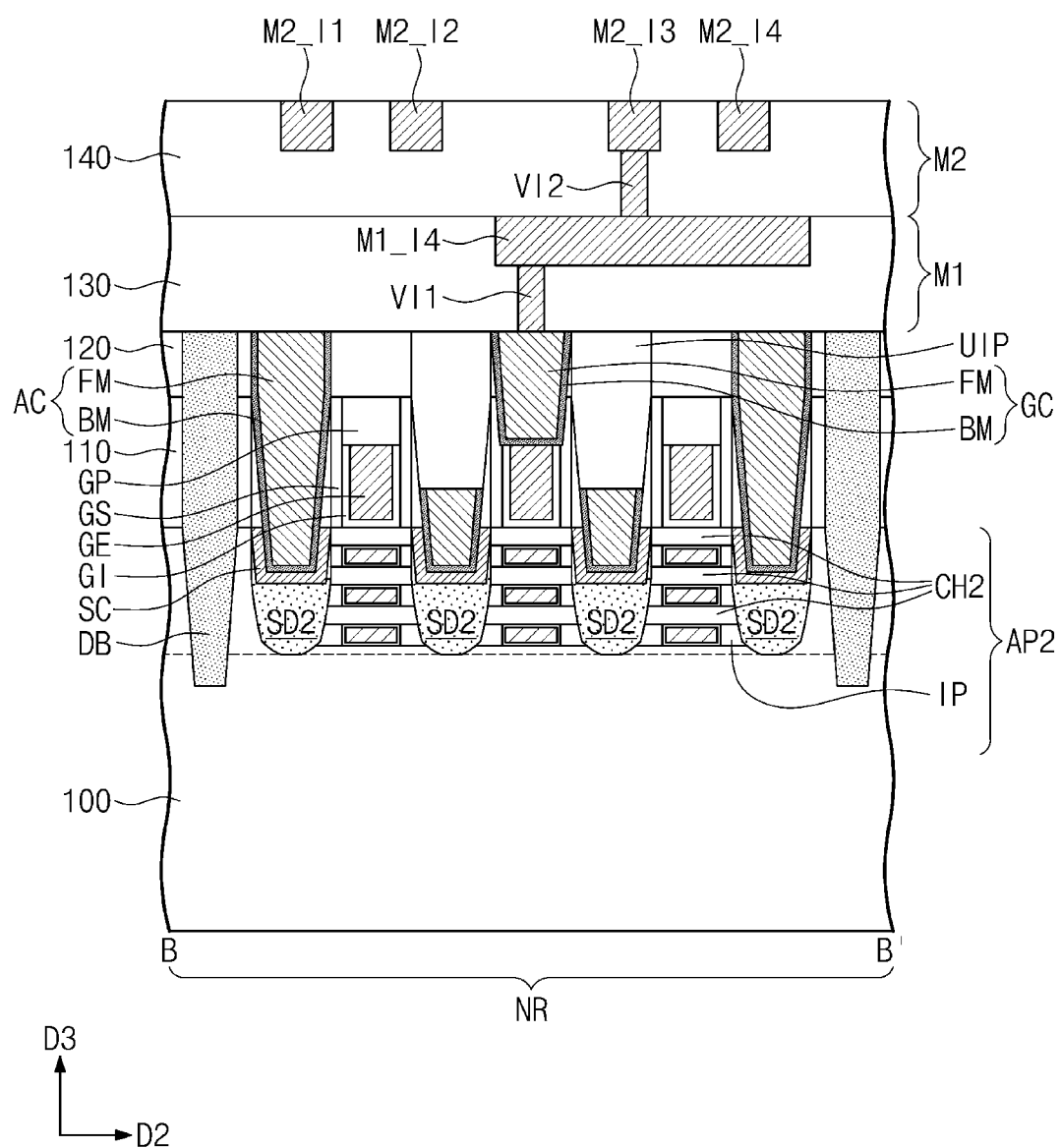
Figure 32C:
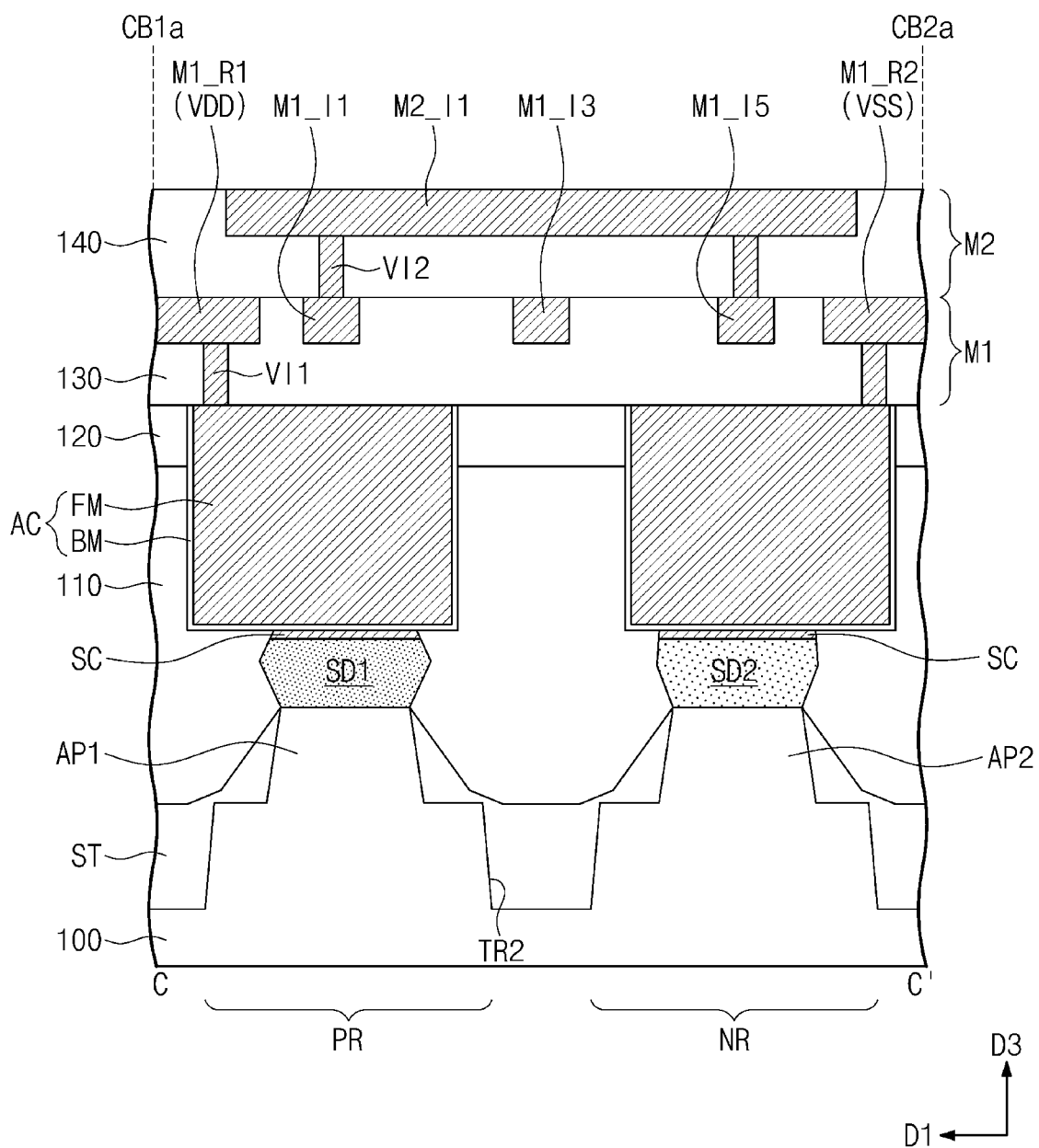
Figure 32D:
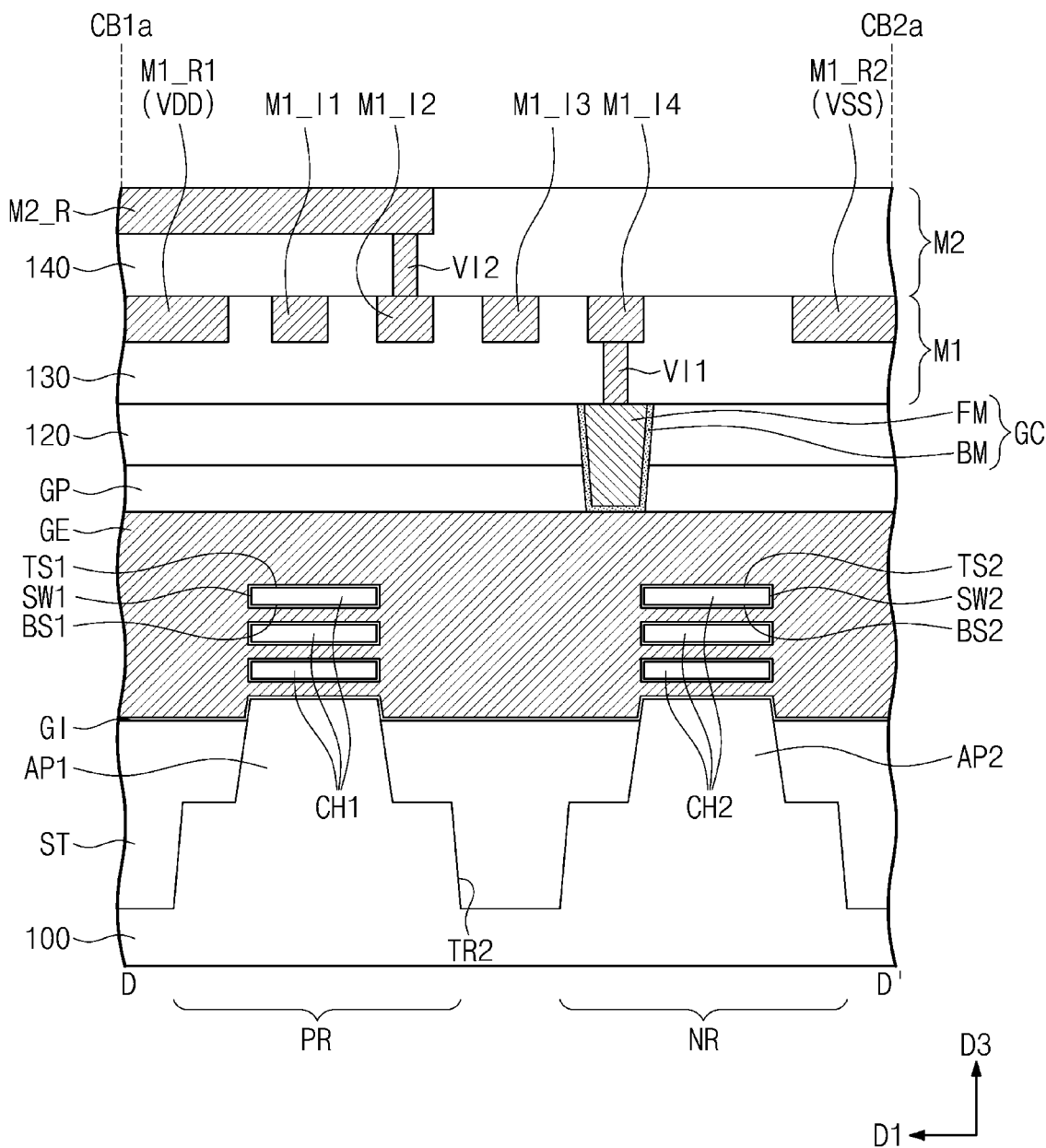

The gate electrode GE may be provided to surround each of the first and second channel patterns CH1 and CH2 (e.g., see FIG. 32D). The gate electrode GE may be provided on a first top surface TS1, at least one first side surface SW1, and a first bottom surface BS1 of the first channel pattern CH1. The gate electrode GE may be provided on a second top surface TS2, at least one second side surface SW2, and a second bottom surface BS2 of the second channel pattern CH2. For example, the gate electrode GE may be provided to face a top surface, a bottom surface and both side surfaces of each of the first and second channel patterns CH1 and CH2. For example, the transistor according to the present embodiment may be a gate-all-around FET (GAAFET) (e.g., MBCFET), in which the gate electrode GE is provided to three-dimensionally surround the channel patterns CH1 or CH2.

The gate dielectric pattern GI may be provided between the gate electrode GE and each of the first and second channel patterns CH1 and CH2. The gate dielectric pattern GI may be provided to surround each of the first and second channel patterns CH1 and CH2.

An insulating pattern IP may be interposed between the gate dielectric pattern GI and the second source/drain pattern SD2, on the second active region NR. The gate electrode GE may be spaced apart from the second source/drain pattern SD2 by the gate dielectric pattern GI and the insulating pattern IP. In an embodiment, the insulating pattern IP may be omitted on the first active region PR.

The first interlayer insulating layer 110 and the second interlayer insulating layer 120 may be provided on the substrate 100. The active contacts AC may be provided to penetrate the first and second interlayer insulating layers 110 and 120 and may be electrically connected to the first and second source/drain patterns SD1 and SD2, respectively. The gate contact GC may be provided to penetrate the second interlayer insulating layer 120 and the gate capping pattern GP and may be electrically connected to the gate electrode GE.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140. The first and second metal layers M1 and M2 may have substantially the same features as those in the embodiments previously described with reference to FIGS. 11 and 12A to 12D.

Even when a size of a standard cell is reduced, a portion of an upper interconnection pattern may extend for an electric connection between the upper and lower interconnection patterns. Here, it may be beneficial to place a cutting pattern, which is used to form a tip-to-tip structure, between the upper interconnection patterns. In a method of designing a semiconductor device according to an embodiment of the inventive concept, a step of placing and routing standard cells may be performed such that the cutting patterns are not successively formed on directly adjacent ones of interconnection tracks. Thus, it may be possible to reduce the number of steps requiring masks, in a process of fabricating a semiconductor device. For example, by forming the tip-to-tip structure, it may be possible to improve reliability of the semiconductor device, and furthermore, it may be possible to reduce cost for a process of fabricating the semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
   a substrate including a first logic cell and a second logic cell, which are adjacent to each other in a first direction and shares a cell border;
   a first metal layer on the substrate, the first metal layer comprising a power line, which is disposed on the cell border to extend in a second direction crossing the first direction and has a center line parallel to the second direction; and
   a second metal layer on the first metal layer,
   wherein the second metal layer comprises a first upper interconnection line of the first logic cell and a second upper interconnection line of the first logic cell provided on the first logic cell, and a first upper interconnection line of the second logic cell and a second upper interconnection line of the second logic cell provided on the second logic cell,
   the first upper interconnection lines extend along a first interconnection track and in the first direction, the first upper interconnection lines having respective curved end lines facing the center line in a plan view,
   the second upper interconnection lines extend along a second interconnection track and in the first direction, the second upper interconnection lines having respective curved end lines facing the center line in the plan view,
   the largest distance between the curved end line of the first upper interconnection line of the first logic cell and the center line in the first direction and the largest distance between the curved end line of the first upper interconnection line of the second logic cell and the center line in the first direction are a first distance,
   the smallest distance between the curved end line of the second upper interconnection line of the first logic cell and the center line in the first direction is a second distance, and
   the first distance is smaller than the second distance.

2. The semiconductor device of claim 1, wherein the first upper interconnection line of the first logic cell and the second upper interconnection line are adjacent to each other in the second direction.

3. The semiconductor device of claim 1, wherein the curved end line of the first upper interconnection line of the first logic cell and the curved end line of the first upper interconnection line of the second logic cell have a concave profile in the plan view.

4. The semiconductor device of claim 1, wherein the smallest distance between the curved end line of the second upper interconnection line of the second logic cell and the center line in the first direction is equal to or larger than the first distance.

5. The semiconductor device of claim 4, wherein the curved end line of the second upper interconnection line of the first logic cell and the curved end line of the second upper interconnection line of the second logic cell have a convex profile in the plan view.

6. The semiconductor device of claim 1, wherein the second metal layer further comprises a third upper interconnection line of the first logic cell and a fourth upper interconnection line provided on the first logic cell, and a third upper interconnection line of the second logic cell and a fourth upper interconnection line of the second logic cell provided on the second logic cell,
   the third upper interconnection lines extend along a third interconnection track and in the first direction,
   the fourth upper interconnection lines extend along a fourth interconnection track and in the first direction, and
   the smallest distance between the third upper interconnection line of the first logic cell and the third upper interconnection line of the second logic cell and the smallest distance between the fourth upper interconnection line of the first logic cell and the fourth upper interconnection line of the second logic cell in the first direction are larger than a sum of the first distance and the second distance.

7. The semiconductor device of claim 6, wherein the third upper interconnection lines and the fourth upper interconnection lines are adjacent to each other in the second direction.

8. The semiconductor device of claim 6, wherein an end portion of the third upper interconnection line and an end portion of the fourth upper interconnection line have a convex profile in the plan view.

9. The semiconductor device of claim 1, wherein an end portion of the first upper interconnection lines vertically overlaps with the power line.

10. The semiconductor device of claim 1, wherein the second metal layer further comprises a routing line which is electrically connected to the first metal layer and is provided to cross the center line.

11. A semiconductor device, comprising:
    a substrate including a first logic cell and a second logic cell, which are adjacent to each other in a first direction and shares a cell border;
    active patterns on the substrate;
    gate electrodes on the active patterns;
    source/drain patterns in upper portions of the active patterns;
    active contacts on the source/drain patterns;
    gate contacts on the gate electrodes;
    a first metal layer on the active contacts and the gate electrodes; and
    a second metal layer on the first metal layer,
    wherein the second metal layer comprises a first upper interconnection line of the first logic cell and a second upper interconnection line of the first logic cell provided on the first logic cell, and a first upper interconnection line of the second logic cell and a second upper interconnection line of the second logic cell provided on the second logic cell,
    the first upper interconnection lines extend along a first interconnection track and in the first direction,
    the second upper interconnection lines extend along a second interconnection track and in the first direction,
    an end portion of the first upper interconnection line of the first logic cell and an end portion of the first upper interconnection line of the second logic cell have concave profiles respectively, when viewed in a plan view, and
    an end portion of the second upper interconnection line of the first logic cell and an end portion of the second upper interconnection line of the second logic cell have convex profiles respectively, when viewed in the plan view.

12. The semiconductor device of claim 11, wherein the first metal layer comprises a power line which is disposed on the cell border to extend in a second direction crossing the first direction and has a center line parallel to the second direction,
- the largest distance between the concave profile of the first upper interconnection line of the first logic cell and the center line and the largest distance between the concave profile of the first upper interconnection line of the second logic cell and the center line in the first direction are a first distance,
- the smallest distance between the convex profile of the second upper interconnection line of the first logic cell and the center line in the first direction is a second distance, and
- the first distance is smaller than the second distance.

13. The semiconductor device of claim 12, wherein the smallest distance between the convex profile of the second upper interconnection line of the first logic cell and the convex profile of the second upper interconnection line of the second logic cell is equal to or larger than a sum of the first distance and the second distance.

14. The semiconductor device of claim 11, wherein the first upper interconnection line and the second upper interconnection line of each of the first logic cell and the second logic cell are spaced apart from each other in a second direction crossing the first direction.

15. The semiconductor device of claim 11, wherein the first upper interconnection lines and the second upper interconnection lines are spaced apart from the center line.

* * * * *